(12) United States Patent
Yamashita et al.

(10) Patent No.: US 7,183,615 B2
(45) Date of Patent: Feb. 27, 2007

(54) NONVOLATILE SEMICONDUCTOR MEMORY AND MANUFACTURING METHOD FOR THE SAME

(75) Inventors: Hiroki Yamashita, Kanagawa (JP); Yoshio Ozawa, Kanagawa (JP); Atsuhiro Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/868,773

(22) Filed: Jun. 17, 2004

(65) Prior Publication Data

US 2005/0045966 A1 Mar. 3, 2005

(30) Foreign Application Priority Data

Jul. 4, 2003 (JP) .............................. 2003-192498

(51) Int. Cl.
*H01L 29/76* (2006.01)
*H01L 29/94* (2006.01)
*H01L 31/00* (2006.01)

(52) U.S. Cl. ...................... 257/390; 257/391; 257/392; 257/524

(58) Field of Classification Search ...................... None
See application file for complete search history.

(56) References Cited

U.S. PATENT DOCUMENTS

| 6,720,610 | B2 | 4/2004 | Iguchi et al. | |
| 2001/0014503 | A1* | 8/2001 | Iguchi et al. | ................ 438/261 |
| 2005/0002231 | A1* | 1/2005 | Ozawa et al. | .......... 365/185.01 |
| 2005/0003619 | A1* | 1/2005 | Tanaka et al. | ............... 438/294 |
| 2005/0184327 | A1* | 8/2005 | Ozawa | ........................ 257/302 |

FOREIGN PATENT DOCUMENTS

| JP | 4-26162 | 1/1992 |
| JP | 2001-168306 | * 6/2001 |

OTHER PUBLICATIONS

J.-D. Lee, et al., IEEE Electron Device Letters, vol. 23, No. 5, pp. 264-266, "Effects of Floating-Gate Interference on NAND Flash Memory Cell Operation", May 2002.

W.-H. Lee, et al., Symposium on VLSI Technology Digest of Technical Papers, pp. 117-118, "A Novel High K Inter-Poly Dielectric(IPD), $Al_2O_3$ for Low Voltage/High Speed Flash Memories: Erasing in MSECS at 3.3V", 1997.

* cited by examiner

*Primary Examiner*—Leonardo Andujar
*Assistant Examiner*—Ahmed N. Sefer
(74) *Attorney, Agent, or Firm*—Oblon, Spivak, McClelland, Maier & Neustadt, P.C.

(57) ABSTRACT

A semiconductor memory has a memory cell matrix encompassing (a) device isolation films running along the column-direction, arranged alternately between the memory cell transistors aligned along the row-direction, (b) first conductive layers arranged along the row and column-directions, top surfaces of the first conductive layers lie at a lower level than top surfaces of the device isolation films, (c) an inter-electrode dielectric arranged both on the device isolation films and the first conductive layers so that the inter-electrode dielectric can be shared by the memory cell transistors belonging to different cell columns' relative dielectric constant of the inter-electrode dielectric is higher than relative dielectric constant of the device isolation films, and (d) a second conductive layer running along the row-direction, arranged on the inter-electrode dielectric. Here, upper corners of the device isolation films are chamfered.

14 Claims, 12 Drawing Sheets

NONVOLATILE SEMICONDUCTOR MEMORY AND MANUFACTURING METHOD FOR THE SAME

CROSS REFERENCE TO RELATED APPLICATIONS

This application claims benefit of priority under 35 USC 119 based on Japanese Patent Application No. P2003-192498 filed Jul. 4, 2003, the entire contents of which are incorporated by reference herein.

BACKGROUND OF THE INVENTION

1. Field of the Invention

The present invention relates to a semiconductor memory and a fabrication method of the semiconductor memory. It is particularly related to a miniaturized nonvolatile semiconductor memory encompassing a plurality of memory cell transistors, each of the memory cell transistors being implemented by a gate electrode structure, which embraces an inter-electrode dielectric sandwiched between a first conductive layer and a second conductive layer. The semiconductor memory encompasses a plurality of cell columns, each of the cell columns embracing serially connected memory cell transistors, and the cell columns being arranged very close to each other.

2. Description of the Related Art

Semiconductor memory devices have been decreasing the inter-cell spacing at approximately 30% per annum through high integration and miniaturization. With nonvolatile semiconductor memories, it is possible to store information in a cell by retaining electric charges in a conductive layer (polycrystalline silicon) that maintains a floating state. With a miniaturized nonvolatile semiconductor memory, the opposing area of each first conductive layer (each floating gate electrode) and corresponding second conductive layer (corresponding control gate electrode) becomes smaller, however, it is necessary to ensure a sufficient capacitance between each first conductive layer and corresponding second conductive layer via corresponding inter-electrode dielectric. In other words, increasing the area in a three-dimensional structure becomes impossible as a result of the reduced inter-cell spacing, whereby it becomes necessary to use an insulating film with a higher dielectric constant than before as the inter-electrode dielectric. However, various inter-cell couplings have become problematic when a high dielectric material is applied as the inter-electrode dielectric.

For example, a nonvolatile semiconductor memory as shown in FIG. 1 has been proposed in relation to this inter-cell coupling (see Japanese Patent Application Laid-open No. 2001-168306). FIG. 1 is a schematic cross sectional view cut along the word line direction, where there are multiple memory cell regions isolated by device isolation films 7 on the surface of a semiconductor substrate (silicon substrate) 1. A gate insulator (tunnel insulator) 2, a first conductive layer (floating gate electrode) 3, inter-electrode dielectrics 9f, and a second conductive layer (control gate electrode) 10 are formed on the surface of the semiconductor substrate 1 in order in each memory cell region. In FIG. 1, the inter-electrode dielectrics 9f are separated between adjacent cells above the device isolation films 7. Then, the second conductive layer (control gate electrode) 10 is filled into the separating areas defined between adjacent inter-electrode dielectrics 9f. The T-shaped inter-electrode dielectric 9f, having projecting overhangs over the device isolation films 7, is provided on top surface of each first conductive layer (floating gate electrode) 3, and a couple of thin vertical walls (sheaths) comprised of a silicon oxide film 9g is arranged between the lower edges of the projecting overhangs implemented by each inter-electrode dielectric 9f and the top surface of the corresponding device isolation film 7.

The cell structure shown in FIG. 1 is an effective structure for prohibiting the transport of electric charges within the first conductive layers 3, preventing the movement of the electric charges between adjacent cells, interrupting the path between the adjacent inter-electrode dielectrics 9f. Furthermore, since the second conductive layer 10 is filled in between the adjacent wing-shaped (T-shaped) protruding portions of the first conductive layers 3, the capacitance between adjacent first conductive layers 3 does not increase. However, there are problems with the cell structure shown in FIG. 1 such that there is a risk of an occurrence of a short-circuit failure between the first and second conductive layers, and the manufacturing yield is reduced since electrical insulation between the first conductive layers 3 and the second conductive layer 10 depends on the weak insulation characteristic of the walls (sheaths) 9g implemented by the thin silicon oxide films.

FIG. 2 is a schematic cross sectional view cut along the word line direction of another earlier nonvolatile semiconductor memory. Differing from the structure shown in FIG. 1, an inter-electrode dielectric 9e is formed, covering the entire surface. Other features and the structure are the same as the features and structure of those shown in FIG. 1.

As shown in FIG. 2, a parallel-plate capacitance C1 is formed between the side surfaces of the adjacent first conductive layers 3, which are floating gate electrodes, and a bypassing edge-capacitance C2 is formed between the edges of the adjacent first conductive layers 3. The bypassing edge-capacitance C2 is ascribable to the edge electric field passing through the inter-electrode dielectric 9e.

With miniaturized nonvolatile semiconductor memories, as the inter-cell spacing decreases, the so-called inter-cell coupling drastically increases between a 'programmed cell' retaining electric charges and an 'erased cell' not retaining electric charges. In the case of an example shown in FIG. 2, in which an insulating film with a higher relative dielectric constant $\in_r$ than the device isolation film 7 for the inter-electrode dielectric 9e is employed, a bypassing edge-capacitance C2 via the inter-electrode dielectric 9e becomes greater than parallel-plate capacitance C1 between the first conductive layers 3, contributing to the problem of inter-cell coupling.

As it is known, electric displacement (dielectric flux density) vector D has a relationship with electric field vector E:

$$D = \in_0 \cdot \in_r \cdot E \quad (1)$$

where $\in_0$ denotes the dielectric constant of vacuum, and $\in_r$ denotes the relative dielectric constant. Accordingly, the dielectric flux within the dielectric material with relative dielectric constant $\in_r$ is $\in_0 \cdot \in_r$ times the electric flux line. Eq. (1) means that, if relative dielectric constant $\in_{IP}$ of the inter-electrode dielectric 9e is sufficiently higher than relative dielectric constant $\in_{STI}$ of the device isolation films 7, electric displacement (dielectric flux density) vector D between adjacent first conductive layers (floating gate electrodes) 3 has a tendency to be confined in the inter-electrode dielectric 9e.

Gauss's law in differential form:

$$\text{div } D = \rho \quad (2)$$

shows that the electric displacement vector D has a local relationship with electric charge density ρ. Then, dielectric fluxes of q lines originate from an electric charge q. On the other hand, capacitance C is represented by:

$$C = q/V \qquad (3)$$

where V denotes inter-electrode potential difference. In other words, when relative dielectric constant $\in_{IP}$ of the inter-electrode dielectric 9e is sufficiently higher than relative dielectric constant $\in_{STI}$ of the device isolation films 7, more charges q are then induced on the upper corner of the mutually opposing first conductive layers 3 at the inter-electrode dielectric 9e side, and bypassing edge-capacitance C2 shown in FIG. 2 becomes relatively noticeable compared to parallel-plate capacitance C1.

Under a condition where parallel-plate approximation holds, with the film thickness of the first conductive layer (floating gate electrode) denoted as $t_{FG}$, and the film thickness of the inter-electrode dielectric denoted as $T_{IP}$, capacitance ratio C2/C1 of parallel-plate capacitance C1 to bypassing edge-capacitance C2 is generally represented by:

$$C2/C1 = (T_{IP} \cdot \in_{IP})/(t_{FG} \cdot \in_{STI}) \qquad (4)$$

Eq. (4) is true in the case where the parallel-plate approximation holds, where the film thickness of the inter-electrode dielectric denoted as $T_{IP}$ is sufficiently small relative to the parallel-plate electrode area, and the electrode edge effect is negligible.

On the contrary, since the geometrical configuration implemented by the first conductive layers 3 and/or the inter-electrode dielectric 9e, as shown in FIG. 2, must consider a three-dimensional geometry effect, application of parallel-plate approximation is difficult. If the cross sectional view of FIG. 2 extends infinitely perpendicular to the plane of the paper so as to provide infinitely long first conductive layers 3, two-dimensional geometry effect must be considered, and application of the parallel-plate approximation is difficult. Although the exact solution must consider the three or two-dimensional geometry effect, when relative dielectric constant $\in_{IP}$ of the inter-electrode dielectric 9e is sufficiently higher than relative dielectric constant $\in_{STI}$ of the device isolation films 7, it is qualitatively understood that the bypassing edge-capacitance C2 ascribable to the electric field confined in the inter-electrode dielectric 9e may become noticeably large compared to the parallel-plate capacitance C1.

Thus, in the case of using a silicon oxide film ($SiO_2$ film) with relative dielectric constant $\in_r = 3.8–4$ as material for the device isolation films 7, usage of a high dielectric constant film, such as an alumina film ($Al_2O_3$ film) with relative dielectric constant $\in_r = 8–11$, a hafnium oxide film ($HfO_2$ film) with relative dielectric constant $\in_r = 22–23$, a zirconium oxide film ($ZrO_2$ film) with relative dielectric constant $\in_r = 22–23$, or a tantalum oxide film ($Ta_2O_5$ film) with relative dielectric constant $\in_r = 25–27$ causes a problem in which the bypassing edge-capacitance C2 becomes noticeable as a stray capacitance relative to the parallel-plate capacitance C1, resulting in an increase in the inter-cell coupling.

SUMMARY OF THE INVENTION

An aspect of the present invention inheres in a semiconductor memory having a memory cell matrix including a plurality of memory cell transistors serially arranged along row- and column-directions, the memory cell matrix encompassing (a) a plurality of device isolation films running along the column-direction, each of the device isolation films arranged alternately between the memory cell transistors aligned along the row-direction, (b) a plurality of first conductive layers arranged along the row and column-directions, a group of the first conductive layers arranged along the column-direction are assigned to a corresponding cell column, adjacent cell columns are isolated from each other by the device isolation film, top surfaces of the first conductive layers lie at a lower level than top surfaces of the device isolation films, (c) an inter-electrode dielectric arranged both on the device isolation films and the first conductive layers so that the inter-electrode dielectric can be shared by the memory cell transistors arranged along the row-direction belonging to different cell columns' the inter-electrode dielectric is made of insulating material different from the first conductive layers, relative dielectric constant of the inter-electrode dielectric is higher than relative dielectric constant of the device isolation films, and (d) a second conductive layer running along the row-direction, arranged on the inter-electrode dielectric so that the second conductive layer can be shared by the memory cell transistors arranged along the row-direction belonging to different cell columns. Here, upper corners of the device isolation films are respectively chamfered in a cross sectional view cut along the row-direction.

Another aspect of the present invention inheres in a semiconductor memory having a memory cell matrix including a plurality of memory cell transistors serially arranged along row-and column-directions, the memory cell matrix encompassing (a) a plurality of device isolation films running along the column-direction, each of the device isolation films arranged alternately between the memory cell transistors aligned along the row-direction, (b) a plurality of first conductive layers arranged along the row and column-directions, a group of the first conductive layers arranged along the column-direction are assigned to a corresponding cell column, adjacent cell columns are isolated from each other by the device isolation film, top surfaces of the first conductive layers lie at a lower level than top surfaces of the device isolation films, (c) an inter-electrode dielectric arranged both on the device isolation films and the first conductive layers so that the inter-electrode dielectric can be shared by the memory cell transistors arranged along the row-direction belonging to different cell columns' the inter-electrode dielectric is made of insulating material different from the first conductive layers, relative dielectric constant of the inter-electrode dielectric is higher than relative dielectric constant of the device isolation films, and (d) a second conductive layer running along the row-direction, arranged on the inter-electrode dielectric so that the second conductive layer can be shared by the memory cell transistors arranged along the row-direction belonging to different cell columns, the second conductive layer having downwardly protruding portions, each having bottom surface facing to corresponding top surface of the first conductive layers. Here, a width of the bottom surface of the downwardly protruding portions measured along the row-direction is larger than a value obtained by subtracting a thickness of the inter-electrode dielectric multiplied by two from a width of the top surface of the first conductive layers measured along the row-direction.

Still another aspect of the present invention inheres in a semiconductor memory having a memory cell matrix including a plurality of memory cell transistors serially arranged along row- and column-directions, the memory cell matrix encompassing (a) a plurality of device isolation films running along the column-direction, each of the device isolation films arranged alternately between the memory cell transistors aligned along the row-direction, (b) a plurality of first conductive layers arranged along the row and column-directions, a group of the first conductive layers arranged along the column-direction are assigned to a corresponding cell column, adjacent cell columns are isolated from each other by the device isolation film, top surfaces of the first conductive layers lie at a lower level than top surfaces of the device isolation films, (c) a plurality of inter-electrode dielectrics aligned along the row-direction on the first conductive layers, each of the inter-electrode dielectrics are separated by a groove arranged on a corresponding device isolation film, relative dielectric constant of the inter-electrode dielectrics is higher than relative dielectric constant of the device isolation films, (d) a plurality of second conductive layers aligned along the row-direction on the inter-electrode dielectric, each of the second conductive layers are separated by the groove arranged on the corresponding device isolation film, (e) a plurality of upper isolation plugs embedded respectively in the grooves; arranged on a corresponding device isolation film; relative dielectric constant of the upper isolation plugs is lower than relative dielectric constant of the inter-electrode dielectric, and (f) a third conductive layer running along the row-direction, arranged on the second conductive layers so that the third conductive layer can be connected to the second conductive layers of the memory cell transistors belonging to different cell columns.

Yet still another aspect of the present invention inheres in a method for manufacturing a semiconductor memory having a memory cell matrix including a plurality of memory cell transistors arranged along row- and column-directions. That is, the method encompasses:

(a) forming a plurality of gate insulators on a semiconductor substrate, a plurality of first conductive layers on the gate insulators and a plurality of device isolation films so that the device isolation films run along the column-direction, top surfaces of the first conductive layers lie at a lower level than top surfaces of the device isolation films;

(b) chamfering upper corners of each of the device isolation films;

(c) forming an inter-electrode dielectric both on the device isolation films and the first conductive layers so that the inter-electrode dielectric can be shared by different cell columns' relative dielectric constant of the inter-electrode dielectric is higher than relative dielectric constant of the device isolation films; and (d) forming a second conductive layer on the inter-electrode dielectric, so that the second conductive layer runs along the row-direction, and that the second conductive layer can be shared by different cell columns.

Yet still another aspect of the present invention inheres in a method for manufacturing a semiconductor memory having a memory cell matrix including a plurality of memory cell transistors arranged along row- and column-directions. That is, the method encompasses:

(a) forming a plurality of gate insulators on a semiconductor substrate, a plurality of first conductive layers on the gate insulators and a plurality of device isolation films so that the device isolation films run along the column-direction;

(b) forming an inter-electrode dielectric both on the device isolation films and the first conductive layers so that the inter-electrode dielectric can be shared by different cell columns' relative dielectric constant of the inter-electrode dielectric is higher than relative dielectric constant of the device isolation films;

(c) forming a second conductive layer on the inter-electrode dielectric;

(d) forming grooves on each of the device isolation film so that the inter-electrode dielectric is divided into a plurality of inter-electrode dielectrics aligned along the row-direction on the first conductive layers, and the second conductive layer is divided into a plurality of second conductive layers aligned along the row-direction on the inter-electrode dielectric;

(e) burying respectively a plurality of upper isolation plugs in the grooves; and (f) depositing a third conductive layer so that the third conductive layer can be connected to the divided second conductive layers belonging to different cell columns.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is earlier in the representation of semiconductor devices, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention.

Prepositions, such as "on", "over" and "under" are defined with respect to a planar surface of the substrate, regardless of the orientation in which the substrate is actually held. A layer is on another layer even if there are intervening layers.

First Embodiment

Figure 3:
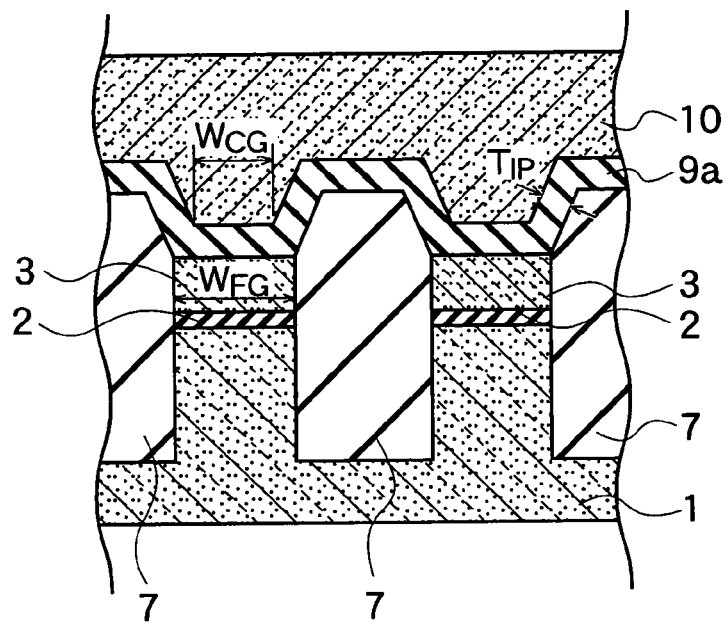
FIG. 3 is a schematic cross sectional view cut along the word line direction showing part of a memory cell matrix of a semiconductor memory according to the first embodiment of the present invention.
Figure 4A:
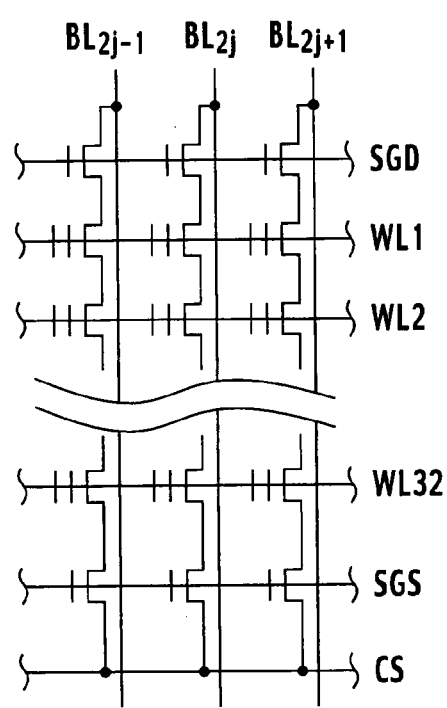
FIG. 4A is an equivalent circuit showing part of a memory cell matrix of the semiconductor memory according to the first embodiment of the present invention.
Figure 4B:
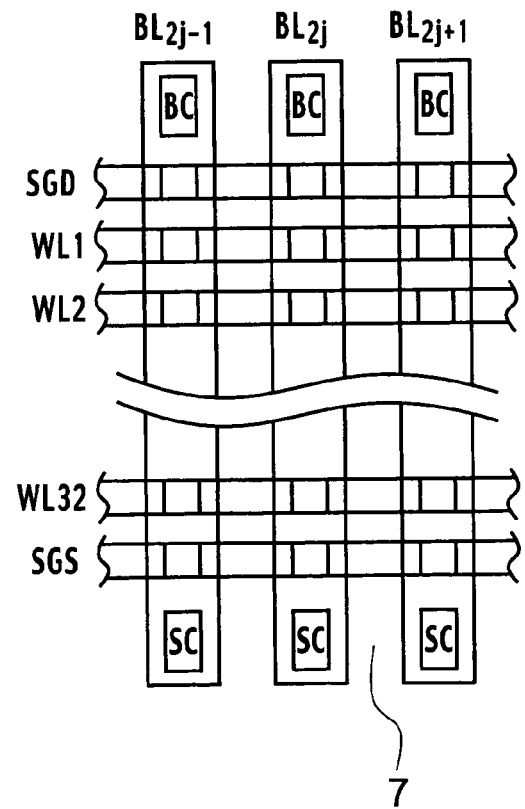
FIG. 4B is a schematic plan view showing an actual geometrical structure of the circuit shown in FIG. 4A.

A semiconductor memory according to a first embodiment of the present invention, as shown in FIGS. 3, 4A and 4B, is NAND flash memory encompassing a memory cell matrix embracing plural cell columns extending along a column-direction, the cell columns being arranged along a row-direction in parallel. Each of the cell columns is implemented by plural memory cell transistors serially arranged along the column-direction. Each of the memory cell transistors has a charge accumulation layer whose electric charge accumulation level is configured to be controlled separately. FIG. 3 is a cross sectional view cut along the length of word lines WL1 through WL32 shown in FIGS. 4A and 4B, thus FIGS. 4A and 4B is described first. The horizontal lines connected to all the memory cell transistors in a row are called the word lines WL1 through WL32.

In other words, the semiconductor memory according to the first embodiment of the present invention, as shown in FIGS. 4A and 4B, encompasses plural word lines WL1, WL2, ... WL32 arranged along the row-direction, and plural bit lines $BL_{2j-1}$, $BL_{2j}$, $BL_{2j+1}$, ... arranged along the column-direction orthogonal to these word lines WL1, WL2, ... WL32. The vertical lines $BL_{2j-1}$, $BL_{2j}$, $BL_{2j+1}$, ..., along which data flows in and out of the memory cell transistors, are called the bit lines. In addition, memory cell transistors, which have respective charge accumulation layers whose electric charge accumulation levels can be controlled separately using plural word lines WL1, WL2, ... WL32, are arranged along the row-direction in FIGS. 4A and 4B. FIGS. 4A and 4B illustrate the case where 32 memory cell transistors are arranged along the column-direction so as to implement each of the cell columns. A pair of select transistors, which select a group of memory cell transistors serially arranged in the cell column, are arranged at both ends of the respective cell columns. The plural cell columns are arranged in parallel, close to each other. Upper select gate line SGD is connected to the respective gates of upper select transistors. Lower select gate line SGS is connected to the respective gates of the lower select transistors. The drain electrode of the upper select transistors are connected to the corresponding bit lines $BL_{2j-1}$, $BL_{2j}$, $BL_{2j+1}$, ... The source electrode of the upper select transistors are connected to the drain electrodes of the uppermost memory cell transistor in the corresponding cell columns. The drain electrode of the lower select transistors are connected to the source electrodes of the lowermost memory cell transistor in the corresponding cell columns, and the source electrode of the lower select transistors are connected to the common source line CS. As it will be appreciated, the terms drain and source can be exchanged without modifying the structure itself.

As shown in FIG. 3, the memory cell matrix of the semiconductor memory according to the first embodiment includes a semiconductor substrate 1, a plurality of device isolation films 7 that have the bottom portions embedded in the top surface of this semiconductor substrate 1, gate insulators 2, which are isolated from each other by these device isolation films 7, and first conductive layers 3. The plurality of device isolation films 7, as shown in FIG. 4B, run parallel to each other like rectangular ridges between each of the plurality of memory cell columns. The gate insulators 2 are isolated from each other by the device isolation films 7, and are formed on the surface of the semiconductor substrate 1 so as to implement part of the memory cell transistors belonging to mutually adjacent memory cell columns, respectively. Upper corners of protrusions implemented by the device isolation films 7 are respectively chamfered. Thus, in the cross sectional view cut along the row-direction (namely, along the length of the word lines WL1, WL2, . . . , WL32) of FIGS. 4A and 4B, the top portion of the protrusions implemented by the device isolation films 7 has a trapezoidal cross-sectional topology.

Moreover, the first conductive layers 3 are isolated from each other by the device isolation films 7, and are formed with a width $W_{FG}$ upon each gate insulator 2 so as to implement a part of the memory cell transistors, which belong to mutually adjacent memory cell columns, respectively. In this case, the top surfaces of the first conductive layers 3 lie at a lower level than the top surfaces of the device isolation films 7, as shown in FIG. 3. In other words, a cross sectional topology in which the top surface of each device isolation film 7 is higher than that of the top surface of each first conductive layer 3 is accomplished.

Because the upper corners of the device isolation films 7 are respectively chamfered in a cross sectional view cut along the row-direction as shown in FIG. 3, the slanting surfaces, or mesa slopes, declining from the top surfaces of each device isolation film 7 to the top surface of each first conductive layer 3 are formed. Each of the mesa slopes (slanting surfaces) intersects the top surface of each first conductive layer 3 at an angle greater than 90° at the corner of the top surface, as shown in FIG. 3.

With the semiconductor memory according to the first embodiment, the inter-electrode dielectric 9a is arranged on the top surface of the first conductive layers 3, and is formed continuously so as to become a common film to adjacent memory cell columns running over every device isolation films 7. Part of the inter-electrode dielectric 9a implements a part of the memory cell transistors in the respective memory cell columns. In addition, as shown in FIG. 3, a second conductive layer 10 is arranged upon the inter-electrode dielectric 9a. The second conductive layer 10 is also formed continuously so as to become a common interconnect to adjacent memory cell columns.

As shown in FIG. 3, the inter-electrode dielectric 9a waves up and down with a constant pitch along the word line direction in accordance with the pitch of each column position. As the inter-electrode dielectric 9a has a thinner film thickness than the level difference between the top surface of each device isolation film 7 and the top surface of each first conductive layer 3, the inter-electrode dielectric 9a manifests into a winding trapezoidal waveform. Namely, the inter-electrode dielectric 9a goes up and down, by tracing the topology implemented by the top portion of the device isolation film 7 and the top surface of the first conductive layer 3 such that the inter-electrode dielectric 9a runs from the top surface of each device isolation film 7, via the chamfered slanting surface continuing to the top surface of each device isolation film 7 to the top surface of the first conductive layer 3.

Figure 1:
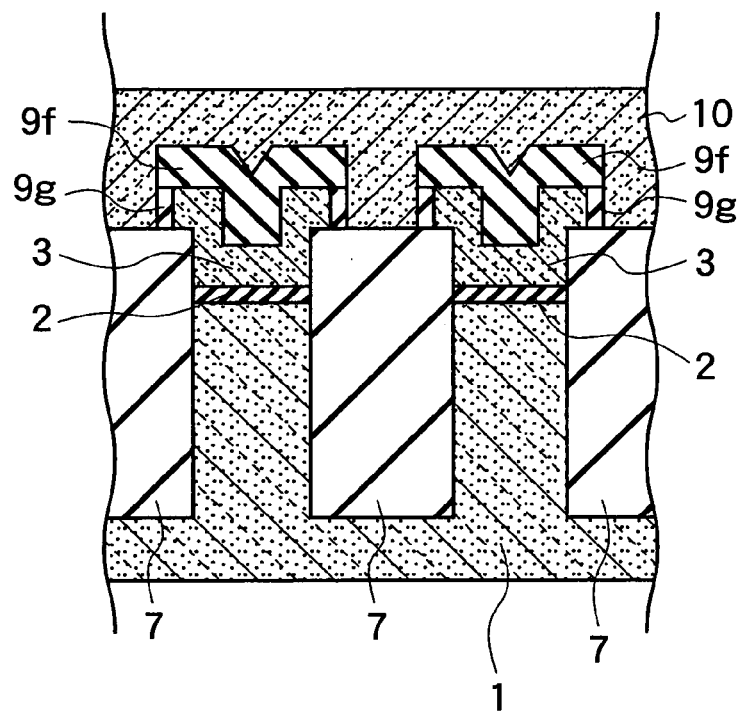
FIG. 1 is a schematic cross sectional view showing part of the memory cell matrix of the earlier semiconductor memory.
Figure 2:
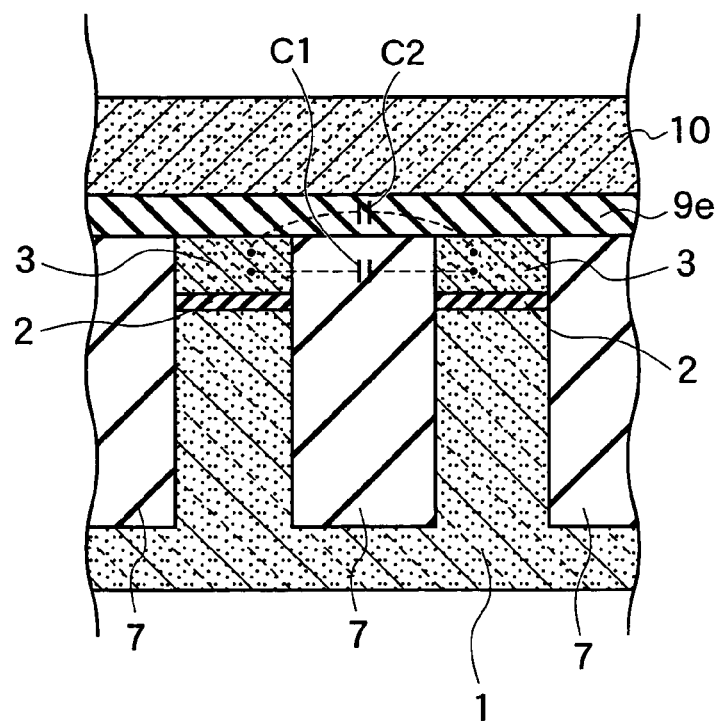
FIG. 2 is a schematic cross sectional view showing part of a memory cell matrix of an earlier semiconductor memory.

As such, the inter-electrode dielectric 9a of the memory cell transistors of the semiconductor memory according to the first embodiment has a winding trapezoidal waveform, which changes up and down with a constant pitch when viewing the cross sectional view cut along the word line direction. In other words, a periodic change in the trapezoidal waveform along the word line direction is achieved, in which the top surface of the device isolation films 7 is higher than the top surface of the first conductive layers (floating gate electrodes) 3, assigned in each of the memory cell columns that are close to each other and partitioned by the device isolation films 7. Therefore, compared to FIG. 2 of the earlier example, the creeping distance of the inter-electrode dielectric 9a, which connects the adjacent cells on each device isolation film 7, becomes longer corresponding to the trapezoidal waveform. As described above, if relative dielectric constant $\in_{IP}$ of the inter-electrode dielectric 9a is sufficiently higher than relative dielectric constant $\in_{STI}$ of the device isolation films 7, the electric field between adjacent first conductive layers (floating gate electrodes) 3 is confined in the inter-electrode dielectric 9a. In other words, when relative dielectric constant $\in_{IP}$ of the inter-electrode dielectric 9a is sufficiently higher than relative dielectric constant $\in$STI of the device isolation films 7, bypassing edge-capacitance C2 resulting from the electric field vector via the inter-electrode dielectric 9a becomes qualitatively larger than parallel-plate capacitance C1, and becomes a key factor in inter-cell coupling (see FIGS. 4A and 4B). However, as shown in FIG. 3, with the structure of the memory cell transistor of the semiconductor memory according to the first embodiment, the electric field vector via the inter-electrode dielectric 9a bypasses the top surface of each trapezoidal device isolation film 7, whereby the creeping distance of the electric field vector becomes longer. Thus, bypassing edge-capacitance C2 via the creeping distance elongated inter-electrode dielectric 9a is reduced.

As shown in FIG. 3, the respective bottom surfaces of the downwardly protruding portions of the second conductive layer 10 are periodically facing to corresponding top surfaces of the first conductive layers 3 with a constant pitch defining the array of columns. Each of the first conductive layers 3 is cut into a topology of a rectangular parallelepiped, and isolated rectangular parallelepipeds are arranged along the column and row-directions. With the structure shown in FIG. 3, the chamfered slanting surfaces of the trapezoidal protrusion implemented by the device isolation film 7 has a tapered topology such that the width of the device isolation film 7 gradually decreases towards the top surface, which may be referred to as 'regular-mesa shape', and thus a large effective parallel-palate electrode area between the first conductive layers (floating gate electrodes) 3 and the downwardly protruding portion of the second conductive layer (control gate electrode) 10 may be ensured, and capacitance reduction may be controlled to a minimum. Furthermore, with the structure according to the first embodiment shown in FIG. 3, since the inter-electrode dielectric 9a has a constant film thickness $T_{IP}$ blanketing the entire surface, short circuit failures do not become a problem between the first conductive layers (floating gate electrodes) 3 and the second conductive layer (control gate electrode) 10.

If the silicon oxide film (SiO$_2$ film) that is used as the device isolation film 7 is used as the 'high dielectric constant insulating film', and used as the inter-electrode dielectric 9a, a material with a higher relative dielectric constant $\in_r$ than the SiO$_2$ film relative dielectric constant $\in_r$=3.8–4 may be a more preferable insulating material. However, the SiO$_2$ film with a relative dielectric constant $\in_r$=3.8–4 may also be employed, if a low dielectric constant material (so-called 'low k material') with a relative dielectric constant $\in_r$ of approximately 1.3–3.5 such as an SOG film, an organic polymer, or a porous insulating film is used as the device isolation films 7.

However, with a miniaturized semiconductor memory with a minimum line width of 100 nm or less, a material that has a higher relative dielectric constant $\in_r$ than the SiO$_2$ film is preferable considering the coupling capacitance relationship between the first conductive layers (floating gate electrodes) 3 and the downwardly protruding portion of the second conductive layer (control gate electrode) 10. It is especially preferable that the material has an even higher relative dielectric constant than the relative dielectric constant $\in_r$=5–5.5 obtained with the ONO film. For example, a single layer film made from any one of a strontium oxide (SrO) film with $\in_r$=6, a silicon nitride (Si$_3$N$_4$) film with $\in_r$=7, an aluminum oxide (Al$_2$O$_3$) film with $\in_r$=8–11, a magnesium oxide (MgO) film with $\in_r$=10, an yttrium oxide (Y$_2$O$_3$) film with $\in_r$=16–17, a hafnium oxide (HfO$_2$) film with $\in_r$=22–23, a zirconium oxide (ZrO$_2$) film with $\in_r$=22–23, a tantalum oxide (Ta$_2$O$_5$) film with $\in_r$=25–27, or a bismuth oxide (Bi$_2$O$_3$) film with $\in_r$=40, or a compound film with multiple layers thereof may be used. Ta$_2$O$_5$ and Bi$_2$O$_3$ lack thermal stability at the interface with the polycrystalline silicon (note that the values of the respective relative dielectric constants $\in_r$ exemplified here are apt to vary according to the fabrication method, possibly deviating from these values in some cases.). Furthermore, it may be a compound film made from a silicon oxide film and the aforementioned films. The compound film may have a stacked structure of three layers or more. In other words, it is preferably an insulating film containing a material with the relative dielectric constant $\in_r$ of 6 or higher in at least a portion thereof. However, in the case of a compound film, selecting a combination that results in having an effective relative dielectric constant $\in_{reff}$ of 6 or greater, measured for the entire film, is preferable. An effective relative dielectric constant $\in_{reff}$ of less than 6 is approximately the same as that of the ONO film, whereby effects greater than those of the ONO film cannot be expected. Moreover, it may also be an insulating film made from a ternary compound such as a hafnium aluminate (HfAlO) film. In other words, an oxide containing at least one of the following elements: strontium (Sr), aluminum (Al), magnesium (Mg), yttrium (Y), hafnium (Hf), zirconium (Zr), tantalum (Ta), and bismuth (Bi), or a silicon nitride containing these elements may be used as the inter-electrode dielectric 9a. It should be noted that a ferroelectric such as strontium titanate (SrTiO$_3$) or barium strontium titanate (BaSrTiO$_3$) is available as the high dielectric constant insulating film material; however, a lack in thermal stability at the interface with the polycrystalline silicon and hysteresis characteristics of the ferroelectric must be considered. It should be noted that the case when using an alumina film as the inter-electrode dielectric 9a is exemplified in the following description, however, it is not limited thereto as it is apparent from the description given above.

The technical advantage of the structure of the memory cell transistor of the semiconductor memory according to the first embodiment is preferably achieved under a condition in which the capacitance ratio C2/C1 is greater than 1, the capacitance ratio C2/C1 is defined by Eq. (4). In the case when using an alumina film as the inter-electrode dielectric 9a, and the capacitance ratio C2/C1 is 1.5, the electrical interference effect may be reduced by approximately fifty percent due to the structure according to the first embodiment.

A fabrication method of the semiconductor memory according to the first embodiment of the present invention is described with reference to FIG. 5A to FIG. 7B. The cross sectional views cut along the length of the bit lines BL$_{2j-1}$, BL$_{2j}$, BL$_{2j+1}$, . . . shown in FIGS. 4A and 4B are omitted from FIG. 5A to FIG. 7B. It should be noted that the fabrication method of the semiconductor memory given below is merely an example, and other various fabrication methods including modifications on this fabrication method may naturally be implemented. (a) To begin with, a gate insulator 2 such as a silicon oxide film or the like is formed with a thickness of approximately 1 to 15 nm through thermal oxidation on a semiconductor substrate 1 made from a p-type silicon substrate. Instead of the p-type silicon substrate, an n-type silicon substrate with p-wells formed therein may be used as the semiconductor substrate 1, with the gate insulator 2 formed thereupon. A first conductive layer 3, which is made of a phosphorous (P)-doped polysilicon or the like, is blanket deposited with a thickness of approximately 10 to 200 nm on the gate insulator 2 by chemical vapor deposition (CVD). Next, a silicon nitride film (Si$_3$N$_4$) 4 is blanket deposited with a thickness of approximately 50 to 200 nm by CVD, and a silicon oxide film 5 is then formed with a thickness of 50 to 400 nm by CVD. The structural cross section of FIG. 5A is then obtained by applying photoresist films 6 upon this silicon oxide film 5, and exposed and developed through photolithography.

Figure 5A:
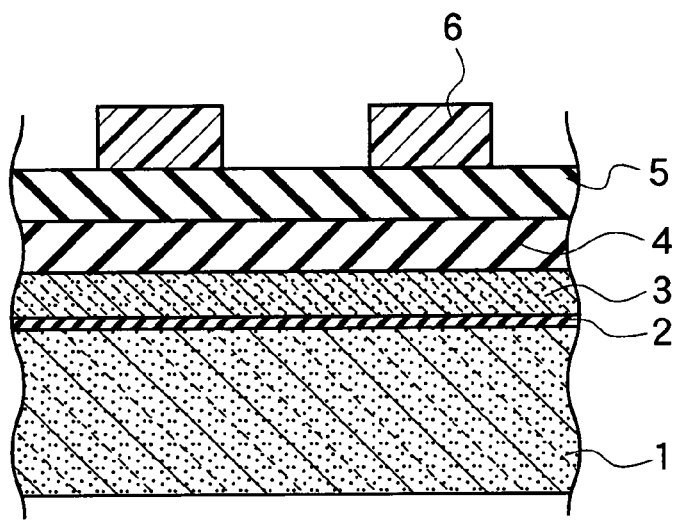
FIG. 5A is a process flow cross section showing part of the memory cell matrix cut along the row-direction shown in FIGS. 4A and 4B, explaining the manufacturing method of the semiconductor memory according to the first embodiment.
Figure 5B:
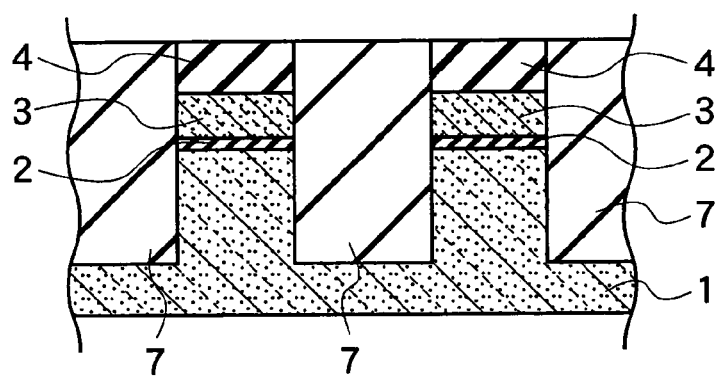
FIG. 5B is a subsequent process flow cross section showing part of the memory cell matrix of the semiconductor memory according to the first embodiment cut along the row-direction after the process stage shown in FIG. 5A.

(b) Next, the silicon oxide film 5 is etched through reactive ion etching (RIE) using the photoresist films 6 shown in FIG. 5A as masks. The photoresist films 6 are removed after the etching process is finished so as to selectively etch the silicon nitride film 4 using the silicon oxide film 5 as a mask. Subsequently, by etching the first conductive layer 3, the gate insulator 2, and the semiconductor substrate (silicon substrate) 1 through RIE, trenches are formed for device isolation. A device isolation film 7 made from a silicon oxide film is then formed with a thickness of 200 to 1500 nm, filling in the device isolation trenches. The cross sectional view of FIG. 5B is then obtained by planarizing through chemical mechanical polishing (CMP) using the silicon nitride film 4 as a stopper.

Figure 5C:
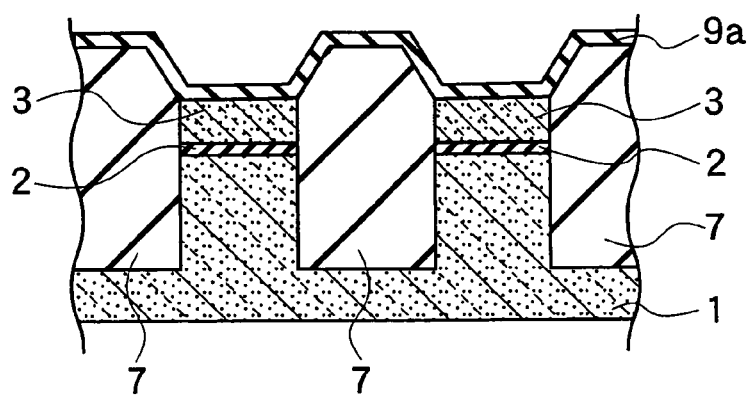
FIG. 5C is a subsequent process flow cross section showing part of the memory cell matrix of the semiconductor memory according to the first embodiment cut along the row-direction after the process stage shown in FIG. 5B.

(c) Next, the silicon nitride film 4 is selectively removed through wet etching using thermal phosphoric acid (H$_3$PO$_4$) or the like, forming rectangular protrusions implemented by the device isolation films 7. Furthermore, the device isolation films 7 made of a silicon oxide film or the like are etched by employing wet etching using a dilute phosphoric acid (HF) solution or the like, or employing dry etching such as RIE. Since the etching rate of the rectangular protrusion corners of the device isolation films 7 is high, the device isolation films 7 are cut into trapezoidal protrusion with a regular-mesa shape, and chamfered slanting surfaces are formed as shown in FIG. 5C.

(d) Subsequently, an alumina film with a higher relative dielectric constant $\in_r$ than the silicon oxide film is blanket deposited by CVD as the inter-electrode dielectric 9a with an equivalent thickness of approximately 1 to 30 nm. The equivalent thickness is calculated in terms of the silicon oxide film thickness. Furthermore, by depositing the second conductive layer 10, which is made of polysilicon doped with phosphorous, on the inter-electrode dielectric 9a with a thickness of 10 to 200 nm, the structural cross section shown in FIG. 3 is completed.

Figure 6:
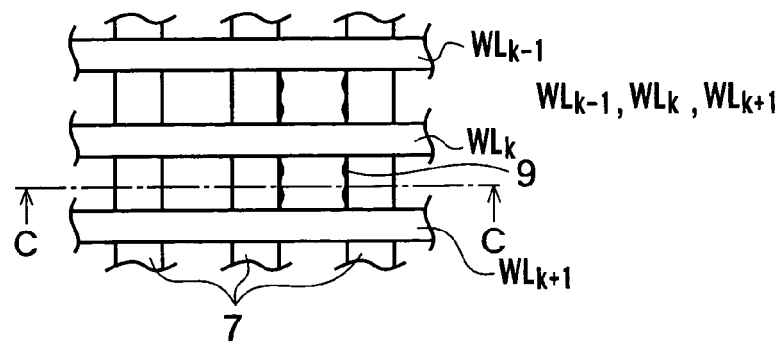
FIG. 6 is a plan view showing part of the memory cell matrix of the semiconductor memory according to the first embodiment after the process stage shown in FIG. 5C.
Figure 7A:
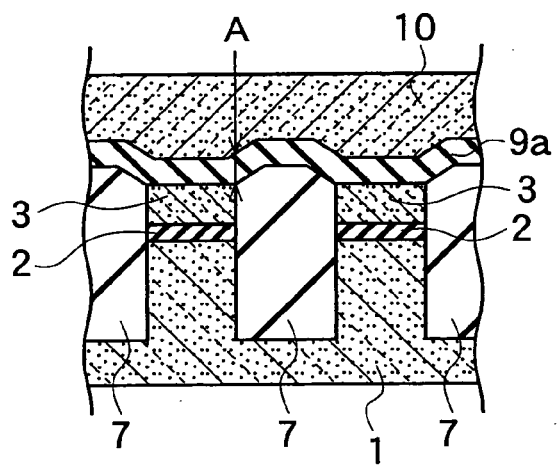
FIG. 7A is a corresponding process flow cross section showing part of the memory cell matrix of the semiconductor memory according to the first embodiment cut along the row-direction of the plan view shown in FIG. 6.
Figure 7B:
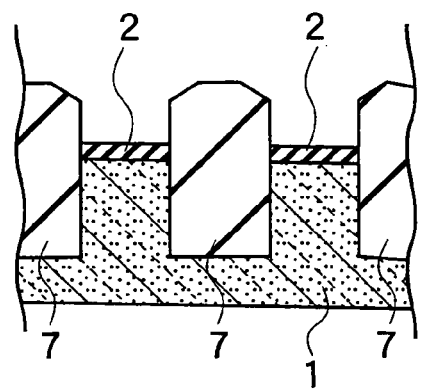
FIG. 7B is a corresponding process flow cross section showing part of the memory cell matrix of the semiconductor memory according to the first embodiment taken on line C—C in FIG. 6.

(e) Further, employing photolithography and RIE, a selective etching is performed to form trenches reaching to the gate insulators 2 along the length of the word lines WLk−1, WLk, WLk+1, . . . in the cell plan view shown in FIG. 6, thereby separating the second conductive layer (control gate electrode) 10, the inter-electrode dielectric 9a, and the first conductive layers (floating gate electrodes) 3, respectively. For example, a resist film is coated on the second conductive layer 10 and is delineated so as to form an etching mask. Through RIE using resist film masks, the second conductive layer (control gate electrodes) 10, the inter-electrode dielectrics 9a, the first conductive layers (floating gate electrodes) 3, and the gate insulators 2 are then successively and selectively etched to form a plurality of slits running parallel along the length of the word lines, which isolate the memory cell transistors aligned in each of the memory columns. The shapes of the first conductive layers (floating gate electrodes) 3 and the second conductive layer (control gate electrodes) 10 are determined accordingly. That is, the shape of each of the first conductive layers 3 is cut into a topology of a rectangular parallelepiped, and isolated rectangular parallelepipeds are arranged along the column and row-directions. The shape of each of the second conductive layer 10 is cut into a ridge running along the row-direction. Each bottom of the second conductive layer 10 has a plurality of downwardly protruding portions periodically facing to corresponding top surfaces of the first conductive layers 3 with a constant pitch defining the array of columns. In other words, in the cross sectional view taken on line C—C as shown in FIG. 7B, the second conductive layer (control gate electrode) 10, the inter-electrode dielectric 9a, and the first conductive layers (floating gate electrodes) 3 do not exist on the top surface of the gate insulators 2. Through this selective etching, a group of memory cell transistors respectively arranged in each memory cell column are isolated from each other.

(f) Next, silicon oxide films, which are called "electrode sidewall films", are formed by thermal oxidation on the exposed side surface of the slits running along the word line direction, or along the row-direction. Then, source and drain diffusion regions for each memory cell transistor are formed in the semiconductor substrate 1 at the bottoms of the respective slits by ion implantation, and serially connected memory cell transistors along the column-direction are formed, the channel length of each of the memory cell transistors are defined by the electrode sidewall film. In this way, the core, or the memory matrix cite of the semiconductor memory according to the first embodiment shown in FIGS. 3, 4A and 4B is completed. Actually, an interlayer insulating film is additionally formed by CVD so as to cover the entire surface, and it goes without saying that bit lines or other interconnects or the like are then formed through a well-known method on the interlayer insulating film.

As such, with the fabrication method of the semiconductor memory according to the first embodiment of the present invention, a reduction in the coupling ratio (coupling capacitance) between the first conductive layers (floating gate electrodes) 3 and the downwardly protruding portion of the second conductive layer (control gate electrode) 10 can be avoided, while at the same time, a structure with a small bypassing edge-capacitance C2 via the creeping distance elongated inter-electrode dielectric 9a may be implemented, so therefore, the fabrication yield is high.

Figure 8A:
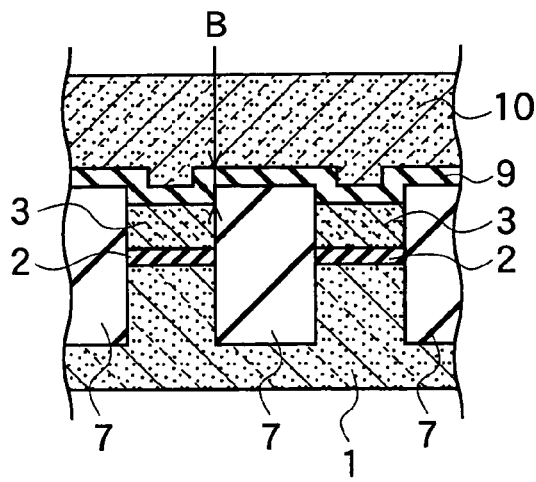
FIG. 8A is a cross sectional view for describing a problem of a fabrication method of a memory cell matrix of a semiconductor memory according to a comparative example, cut along the row-direction of the plan view shown in FIG. 6.
Figure 8B:
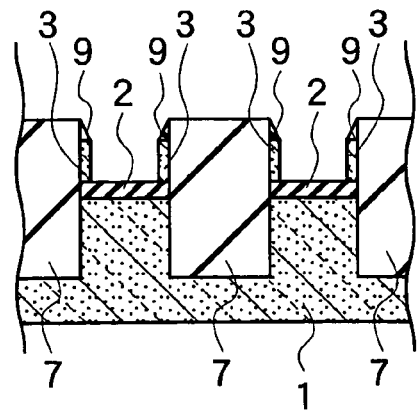
FIG. 8B is a corresponding cross sectional view showing part of the memory cell matrix of the semiconductor memory according to the comparative example taken on line C—C in FIG. 6.

Furthermore, in the isolating step of the memory cell transistors, residue from the first conductive layers 3 on the vertical sidewalls of the device isolation films 7 in the cross sectional view taken on line C—C in FIG. 6 can be avoided (indicated as a conductive layer residual film 9 in FIG. 6). This is described using FIG. 8A, which is a structural cross section prior to processing using a memory cell structure as a comparative example, and FIG. 8B, which is a structural cross section after processing. With the fabrication method of a semiconductor memory of the comparative example, the 'height B' (see FIG. 8A) of the inter-electrode dielectric 9, which is measured at the vertical sidewalls of the rectangular protrusions implemented by the device isolation films 7, is greater than 'height A' ('height B'>'height A') of the inter-electrode dielectric 9a, which is measured at the chamfered slanting surface of the trapezoidal protrusions implemented by the device isolation films 7 in the fabrication method of the semiconductor memory according to the first embodiment. Thus, after the isolating process for the memory cell transistors, as shown in FIG. 8B, part of the inter-electrode dielectric 9 tend to remain on the vertical sidewalls of the device isolation films 7. Furthermore, using this as a mask material, part of the first conductive layers 3 also tends to remain on the vertical sidewalls of the device isolation films 7. On the contrary, with the fabrication method of the semiconductor memory according to the first embodiment, residue of the first conductive layers 3 on the vertical sidewalls of the device isolation films 7 can be avoided.

As a result, with the fabrication method of the semiconductor memory according to the first embodiment, the occurrence of short circuit failures ascribable to a residual film of the first conductive layers 3 may be reduced.

It should be noted that the semiconductor memory or the fabrication method thereof according to the first embodiment is not limited to the NAND flash memory shown in FIGS. 4A and 4B, and is naturally applicable to various nonvolatile memories, such as NOR flash memory, DINOR flash memory, AND flash memory, each of the nonvolatile memories encompasses one or more transistors having floating gates serving as the electric charge accumulating layers. One of the examples of the nonvolatile memories is AND flash memory, of which the equivalent circuit is given in FIG. 9.

Figure 9:
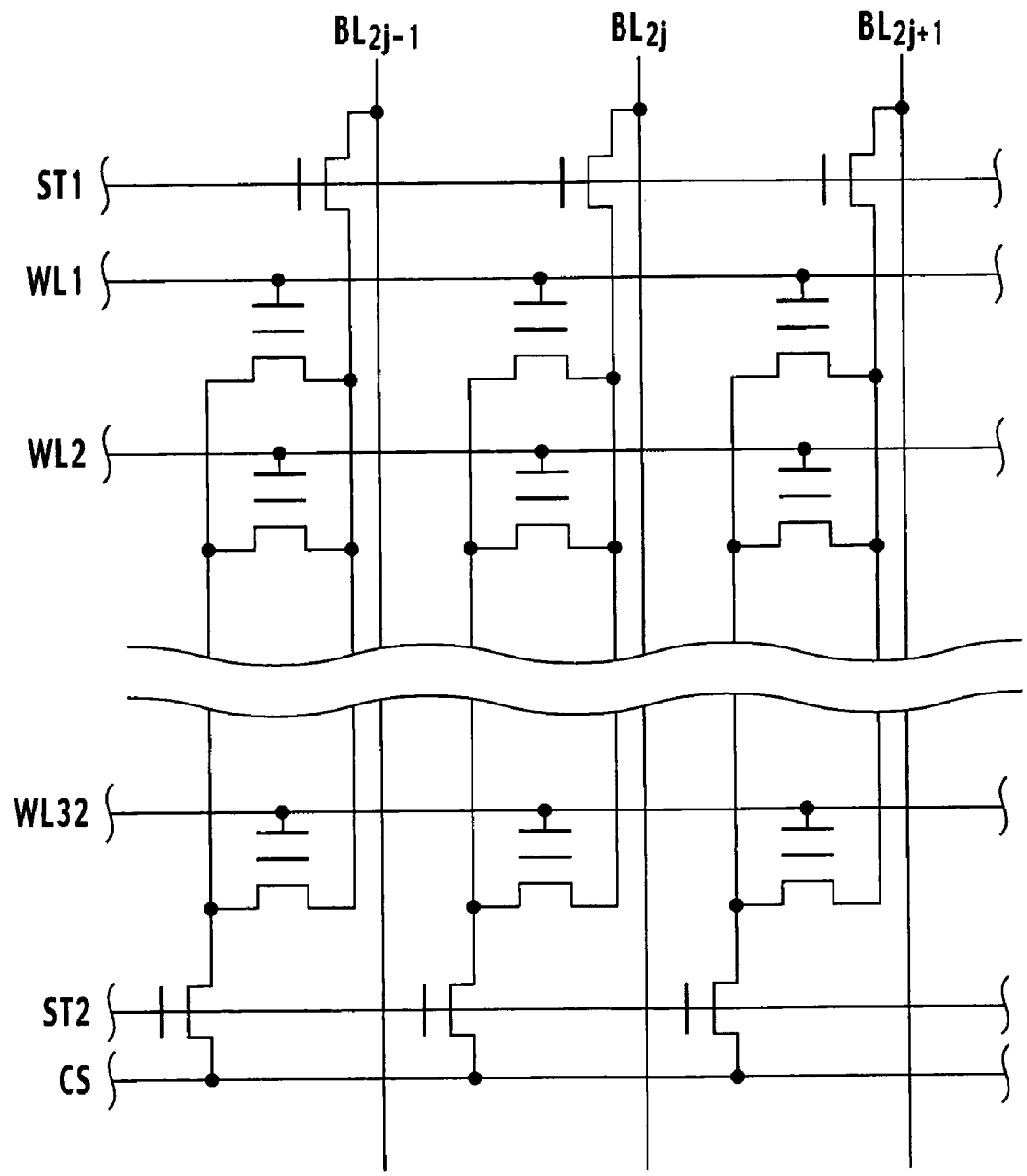
FIG. 9 is an equivalent circuit illustrating a modified example of the memory cell matrix of the semiconductor memory according to the first embodiment of the present invention.

In the AND flash memory, memory cell transistors sharing the same gate constitute the word lines WL1, WL2, . . . WL32 arranged along the horizontal direction. And memory cell transistors sharing the same drain electrode and same source electrode constitute bit lines $BL_{2j-1}$, $BL_{2j}$, $BL_{2j+1}$, . . . arranged along the vertical direction, orthogonal to these word lines WL1, WL2, . . . WL32. FIG. 9 illustrates the case where 32 memory cell transistors are arranged along the column-direction so as to implement each of the cell columns. A pair of select transistors, which select a group of memory cell transistors serially arranged in the cell column, are arranged at both ends of the cell column array. The plural cell columns are arranged in parallel, close to each other. Upper select gate line ST1 is connected to the respective gates of upper select transistors. Lower select gate line ST2 is connected to the respective gates of the lower select transistors. The respective drain electrodes of the upper select transistors are connected to the corresponding bit lines $BL_{2j-1}$, $BL_{2j}$, $BL_{2j+1}$, . . . The source electrodes of the upper select transistors are connected to the drain electrodes of memory cell transistors constituting the corresponding cell columns. The drain electrode of the lower select transistors are connected to the source electrodes of memory cell transistors constituting the corresponding cell columns, and the source electrodes of the lower select transistors are connected to the common source line CS. As will be appreciated, the terms drain and source can be exchanged without modifying the structure itself. The structure and materials of the memory cell transistors are similar to the structure and materials already explained in the NAND flash memory, and an overlapping or redundant description may be omitted in the AND flash memory.

Second Embodiment

Figure 10A:
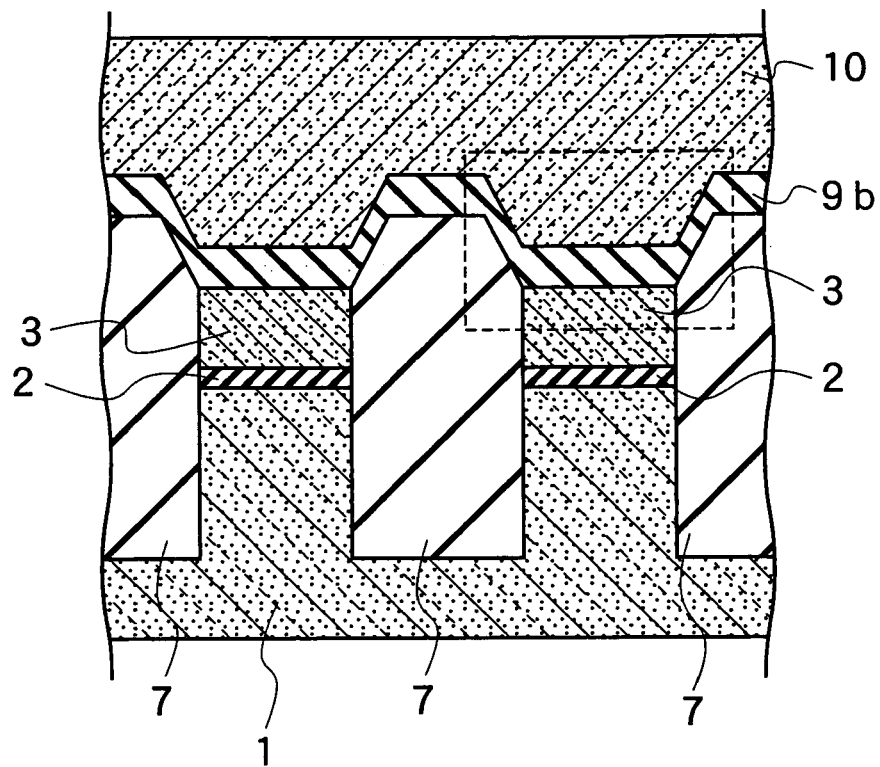
FIG. 10A is a schematic cross sectional views cut along the word line direction showing part of a memory cell matrix of a semiconductor memory according to a second embodiment of the present invention.
Figure 10B:
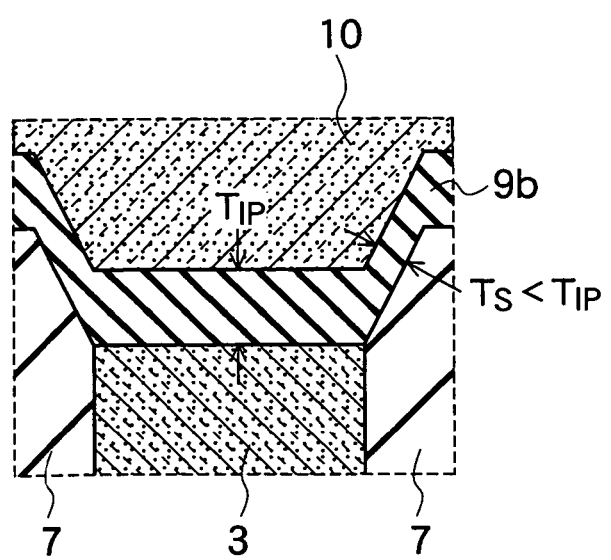
FIG. 10B is an enlarged cross sectional view showing details of the part encircled by a dashed line in FIG. 10A.

FIGS. 10A and 10B are cross sectional views cut along the length of the word lines WL1, WL2, . . . , WL32 shown in FIG. 4B. Similarly to the cross sectional structure explained in the first embodiment, the respective bottom surfaces of the downwardly protruding portions of the second conductive layer 10 are periodically facing to corresponding top surfaces of the first conductive layers 3 with a constant pitch defining the array of columns, as shown in FIG. 10A. Although the illustration of the plan view is omitted, each of the first conductive layers 3 is cut into a topology of a rectangular parallelepiped, and isolated rectangular parallelepipeds are arranged along the column and row-directions.

An array of memory cell transistors of a semiconductor memory according to a second embodiment of the present invention, as shown in FIG. 10A, has a transitional film thickness $T_S$ of the inter-electrode dielectric 9b, which is measured at a portion in contact with the chamfered slanting surfaces of the trapezoidal protrusion implemented by the device isolation film 7, being thinner than the film thickness $T_{IP}$ of the inter-electrode dielectric 9b measured at the top surface of the first conductive layers (floating gate electrodes) 3 as shown in FIG. 10B:

$$T_S < T_{IP} \quad (5)$$

As a result, a reduction in the memory cell coupling ratio (coupling capacitance) can be avoided by keeping the parallel-plate electrode area between the first conductive layers (floating gate electrodes) 3 and the downwardly protruding portion of the second conductive layer (control gate electrode) 10 large, while reducing the stray capacitance between the first conductive layers (floating gate electrodes) 3 of adjacent cells.

The technical advantage of the structure of the memory cell transistor of the semiconductor memory according to the second embodiment shown in FIGS. 10A and 10B is preferably achieved when the capacitance ratio C2/C1, defined by Eq. (4), is greater than 1. When the capacitance ratio C2/C1 is 1.5, the electrical interference effect of the structure according to the second embodiment may be further reduced by approximately twenty percent in comparison with the structure according to the first embodiment. Otherwise, it is effectively the same as the first embodiment, and thus duplicate descriptions are omitted.

A fabrication method of the semiconductor memory according to the second embodiment is described with reference to FIG. 11A and FIG. 11B. It should be noted that the fabrication method of the semiconductor memory given below is merely an example, and other various fabrication methods including modifications on this fabrication method may naturally be implemented.

Figure 11A:
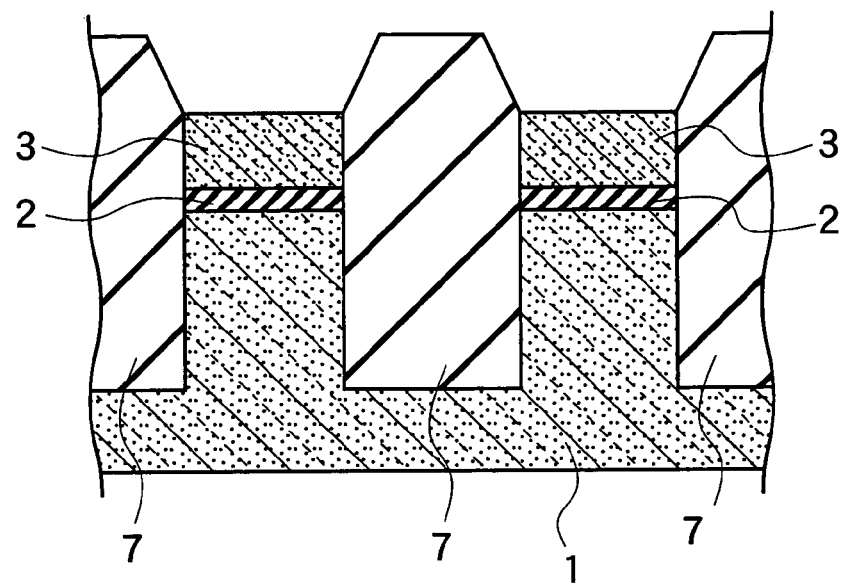
FIG. 11A is a process flow cross section showing part of the memory cell matrix cut along the row-direction, explaining the manufacturing method of the semiconductor memory according to the second embodiment.

(a) The structural cross section of FIG. 11A is obtained by the same method as the fabrication method of the semiconductor memory according to the first embodiment. Next, a silicon nitride film is deposited on the entire surface, including the trapezoidal protrusion of the device isolation films 7 and the top surface of the first conductive layers (floating gate electrodes) 3 by CVD.

Figure 11B:
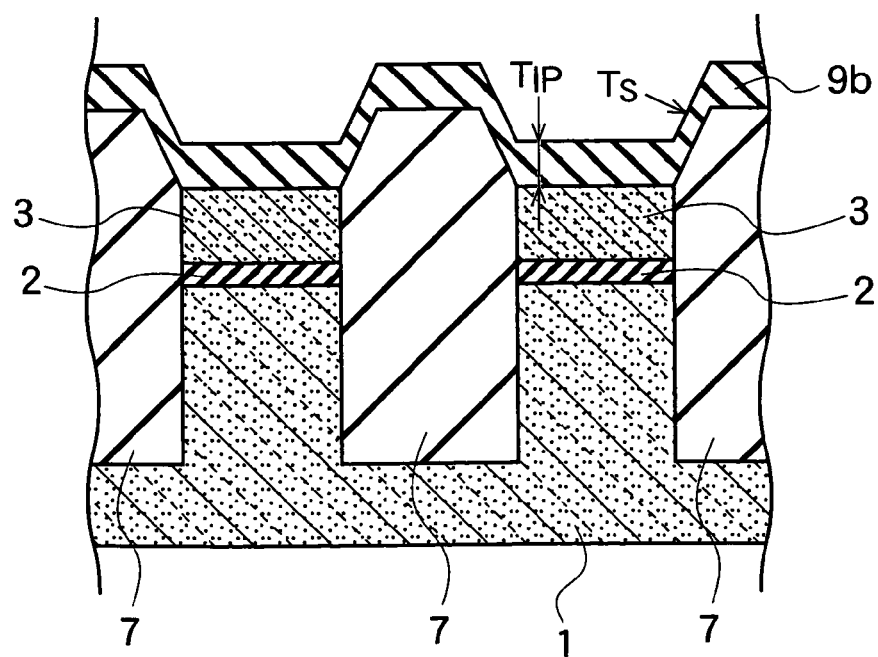
FIG. 11B is a subsequent process flow cross section showing part of the memory cell matrix of the semiconductor memory according to the second embodiment cut along the row-direction after the process stage shown in FIG. 11A.

(b) Once the silicon nitride film is blanket deposited, an alumina film is blanket deposited upon the silicon nitride film by sputtering with strong directivity (anisotropy), and as shown in FIG. 11B, the inter-electrode dielectric 9b, which is made from a stacked film of alumina film and silicon nitride film, is blanket deposited with an equivalent thickness of approximately 1 to 30 nm in terms of the silicon oxide film thickness. The sputtering with strong directivity should be executed under the condition such that an internal pressure of a chamber during deposition is low, so as to lengthen the mean free path of the sputtered atoms. Due to the alumina film formed by sputtering having anisotropy (with strong directivity), film thickness $T_S$ of the inter-electrode dielectric 9b deposited on the chamfered slanting surfaces of the trapezoidal protrusion implemented by the device isolation film 7 is thinner than the film thickness $T_{IP}$ of the top surface of the first conductive layers (floating gate electrodes) 3. The physical vapor deposition method or bias plasma CVD or the like are also available as the 'deposition method with strong directivity', besides sputtering.

(c) Subsequently, forming the second conductive layer 10, which is made of phosphorous doped polysilicon, with a thickness of approximately 10 to 200 nm, completes the structural cross section of the memory cell transistor of the semiconductor memory according to the second embodiment shown in FIGS. 10A and 10B.

As such, with the fabrication method of the semiconductor memory according to the second embodiment of the present invention, a reduction in the coupling ratio (coupling capacitance) between the first conductive layers (floating gate electrodes) 3 and the downwardly protruding portion of the second conductive layer (control gate electrode) 10 can be avoided, while at the same time, a structure with a small bypassing edge-capacitance C2 via the creeping distance elongated inter-electrode dielectric 9b may be easily implemented. Furthermore, as with the first embodiment, in the isolating step of the memory cell transistors, residue from the first conductive layer 3 on the vertical sidewalls of the device isolation films 7 on the dotted line in FIG. 6 can be avoided. Thus, the occurrence of short circuit failures ascribable to a residual film from the first conductive layers 3 may be reduced.

It should be noted that with the structure of the memory cell transistor of the semiconductor memory according to the second embodiment, part of forming the inter-electrode dielectric 9b has employed sputtering, and a stacked film of alumina film and silicon nitride film has been described, however, the second embodiment is not limited to the structure and method described above. The semiconductor memory according to the second embodiment may be implemented even with a single-layered high dielectric constant film of one of the various insulating films described regarding the semiconductor memory according to the first embodiment. They are selected as the high dielectric constant insulating film, or as a multi-layered structure of combinations of two or more layers of a silicon oxide film, a silicon nitride film, or another high dielectric constant film.

Third Embodiment

Figure 12A:
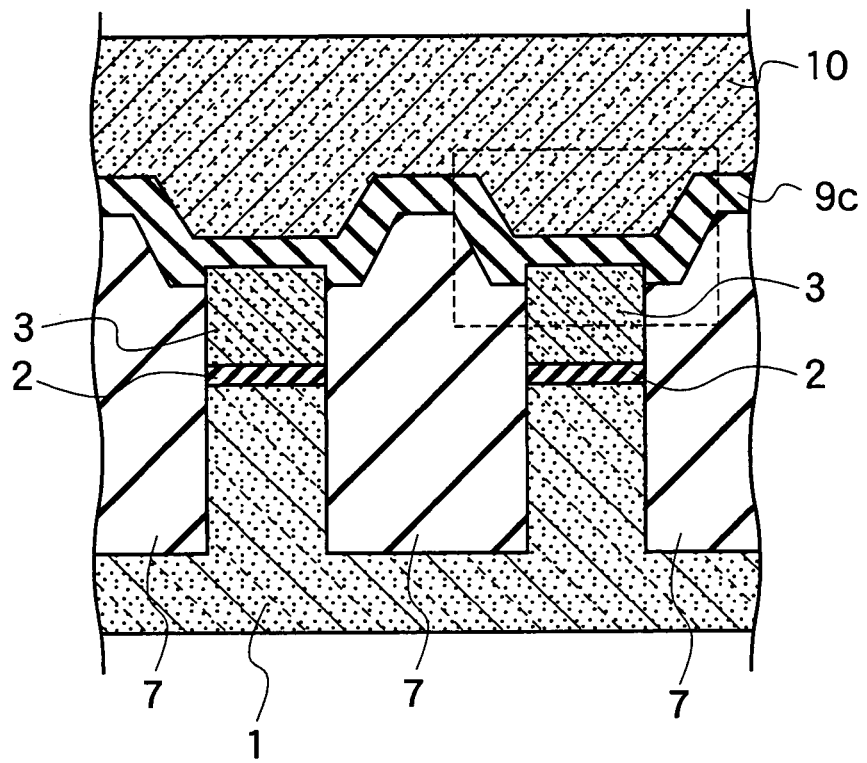
FIG. 12A is a schematic cross sectional views cut along the word line direction showing part of a memory cell matrix of a semiconductor memory according to a third embodiment of the present invention.
Figure 12B:
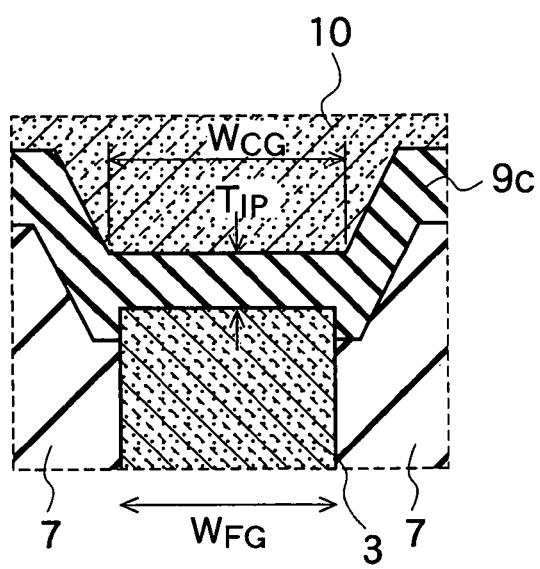
FIG. 12B is an enlarged cross sectional views showing details of the part encircled by a dashed line in FIG. 12A.

FIGS. 12A and 12B are cross sectional views cut along the length of the word lines WL1, WL2, . . . , WL32 shown in FIG. 4B. With the structure of the memory cell transistor of the semiconductor memory according to the first and second embodiments, width $W_{CG}$ of the bottom surface of the downwardly protruding portions of the second conductive layer (control gate electrode) 10 is greater than the resulting value of subtracting twice the measurement of the film thickness $T_{IP}$ of the inter-electrode dielectric from width $W_{FG}$ of the top surface of the first conductive layers (floating gate electrodes) 3. As shown in FIG. 12A, the respective bottom surfaces of the downwardly protruding portions of the second conductive layer 10 are periodically facing to corresponding top surfaces of the first conductive layers 3 with a constant pitch defining the array of columns. Although the illustration of the plan view is omitted, each of the first conductive layers 3 is cut into a topology of a rectangular parallelepiped, and isolated rectangular parallelepipeds are arranged along the column and row-directions, which is similar to the configuration explained in the first and second embodiments. Here, width $W_{CG}$ of the bottom surface of the downwardly protruding portions of the second conductive layer (control gate electrode) 10 and width $W_{FG}$ of the top surface of the first conductive layers 3 as shown in FIG. 12B, are measured along the row-direction (word line direction) as shown in FIG. 4B. In other words, they are formed to satisfy the relationship:

$$W_{CG} > W_{FG} - 2 \times T_{IP} \quad (6)$$

As a result, a reduction in the memory cell coupling ratio (coupling capacitance) can be avoided by keeping the parallel-plate electrode area between the first conductive layers (floating gate electrodes) 3 and the downwardly protruding portion of the second conductive layer (control gate electrode) 10 large, while reducing the stray capacitance between the first conductive layers (floating gate electrodes) 3 of adjacent cells. In other words, the slanting surfaces of the trapezoidal protrusion implemented by the device isolation film 7 has the topology of a regular-mesa shape, and thus a large effective parallel-plate electrode area between the first conductive layers (floating gate electrodes) 3 and the downwardly protruding portion of the second conductive layer (control gate electrode) 10 may be ensured, and capacitance reduction may be controlled to a minimum, while satisfying the relationship of Eq. (6).

The structure of a memory cell transistor of a semiconductor memory according to a third embodiment satisfies the relationship $$W_{CG} > W_{FG} \quad (7)$$

instead of Eq. (6), which is what differs from the structure of the memory cell transistor of the semiconductor memory according to the first and second embodiments. In order to satisfy the relationship in Eq. (7), the height of the top surface of each device isolation film 7 at the interface between each device isolation film 7 and each first conductive layer (floating gate electrode) 3 is at a lower position than the top surface of the first conductive layers (floating gate electrodes) 3 in FIGS. 12A and 12B. In other words, it is a structure in which the trapezoidal chamfer, which makes the mesa slope on the top portion of each device isolation film 7, or a tangential plane of the mesa slope, which may be defined as an extended portion of the mesa slope, intersects with the side surface of each first conductive layer (floating gate electrode) 3.

According to the structure shown in FIGS. 12A and 12B, satisfying Eq. (7), a larger parallel-plate electrode area between the first conductive layers (floating gate electrodes) 3 and the downwardly protruding portion of the second conductive layer (control gate electrode) 10 can be ensured, while reducing the stray capacitance between the first conductive layers (floating gate electrodes) 3 of adjacent cells. This fact has an advantage in that it avoids a reduction in the memory cell coupling ratio (coupling capacitance). Otherwise, it is effectively the same as the first embodiment, and thus duplicate descriptions are omitted.

The technical advantage of the structure of the memory cell transistor of the semiconductor memory according to the third embodiment is preferably achieved under a condition in which the capacitance ratio C2/C1 is greater than 1, where the capacitance ratio C2/C1 is defined by Eq. (4). When the capacitance ratio C2/C1 is 1.5, the electrical interference effect of the structure according to the third embodiment increases by approximately twenty percent and the coupling ratio increases, in comparison with the structure according to the first embodiment.

A fabrication method of the semiconductor memory according to the third embodiment of the present invention is described with reference to FIG. 13A and FIG. 13B. It should be noted that the fabrication method of the semiconductor memory given below is merely an example, and other various fabrication methods including modifications on this fabrication method may naturally be implemented.

Figure 13A:
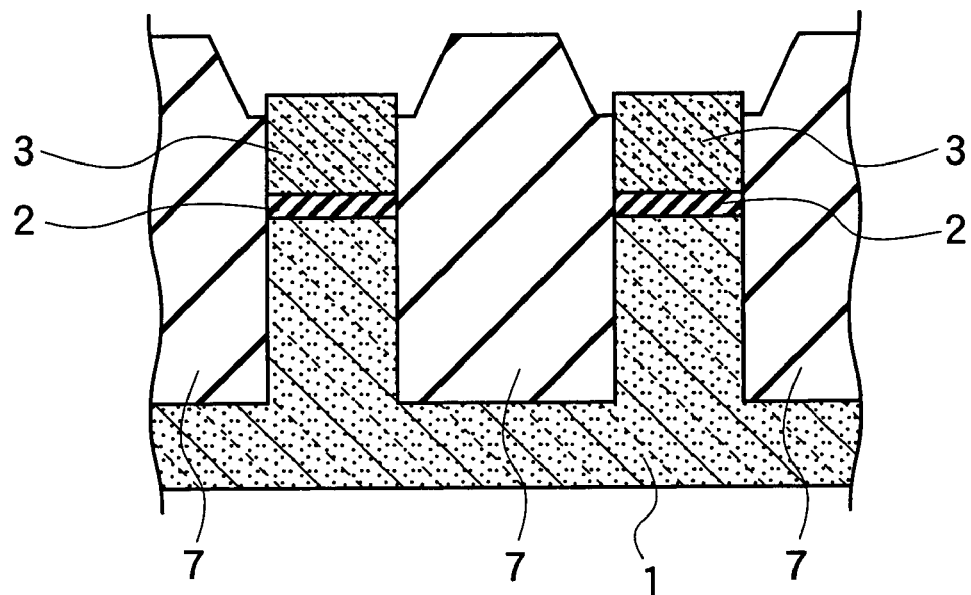
FIG. 13A is a process flow cross section showing part of the memory cell matrix cut along the row-direction, explaining the manufacturing method of the semiconductor memory according to the third embodiment.
Figure 13B:
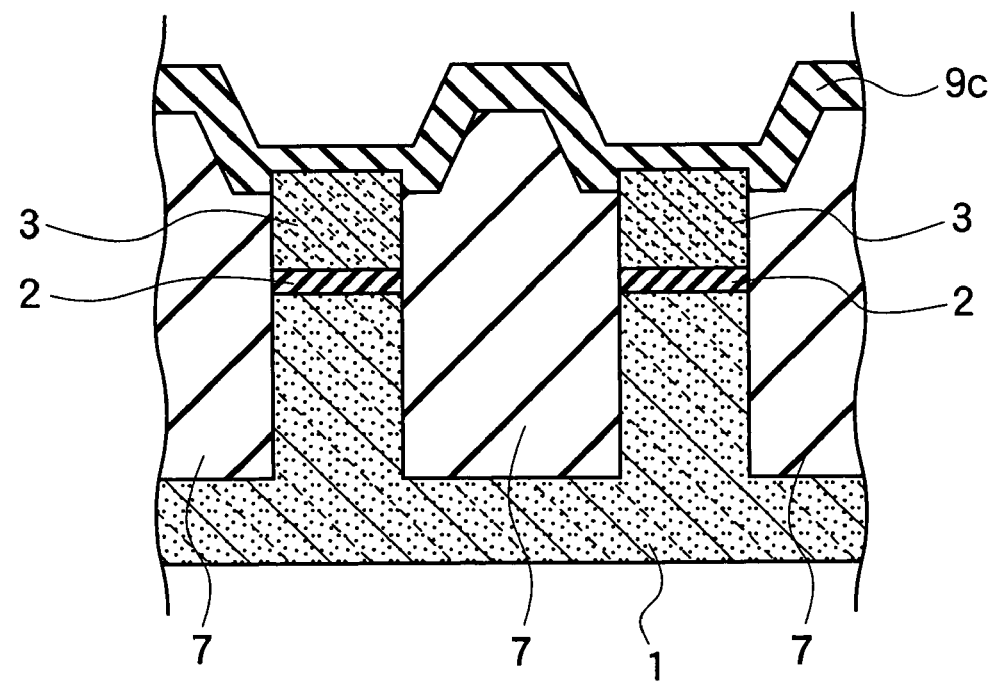
FIG. 13B is a subsequent process flow cross section showing part of the memory cell matrix of the semiconductor memory according to the third embodiment cut along the row-direction after the process stage shown in FIG. 13A.

(a) The structural cross section of FIG. 13A is obtained by the same method as the fabrication method of the semiconductor memory according to the first embodiment. However, the slanting surface of the device isolation films 7 are excessively etched to expose the top corners of the first conductive layer (floating gate electrode) 3, as shown in FIG. 13A. The excessive etching establishes the topology in which a tangential plane of the slanting surface of the device isolation films 7 intersects with the side surface of the first conductive layer 3. Namely, in the topology shown in FIG. 13A, additional recesses are formed around the exposed top corners of the first conductive layer 3 so as to expose side surfaces of the first conductive layer 3. Here, the device isolation films 7 may be made from a silicon oxide film or the like, for example. In addition to the slanting surface being recessed, the height of the top surface of each device isolation film 7 at the interface between each device isolation film 7 and each first conductive layer (floating gate electrode) 3 becomes lower than the top surface of the first conductive layers (floating gate electrodes) 3. Thus, a level difference portion (trench portion) generates between the top surface of each device isolation film 7 and the top surface of the corresponding first conductive layer 3.

(b) Next, the inter-electrode dielectric 9c, which is made from a stacked film of hafnium oxide film and alumina film, is blanket deposited with an equivalent thickness of approximately 1 to 30 nm in terms of the silicon oxide film thickness by CVD. Then the structural cross section of FIG. 13B is obtained.

(c) Blanket depositing the second conductive layer 10 made of a phosphorous doped polysilicon or the like, with a thickness of approximately 10 to 200 nm, by CVD completes the structure of the memory cell transistor of the semiconductor memory according to the third embodiment as shown in FIGS. 12A and 12B.

As such, with the fabrication method of the semiconductor memory according to the third embodiment of the present invention, a reduction in the coupling ratio (coupling capacitance) between the first conductive layers (floating gate electrodes) 3 and the downwardly protruding portion of the second conductive layer (control gate electrode) 10 can be avoided, while at the same time, a structure with a small bypassing edge-capacitance C2 via the creeping distance elongated inter-electrode dielectric 9c may be implemented, so therefore the fabrication yield is high. Furthermore, as with the first and second embodiments, in the isolating step of the memory cell transistors, residue from the first conductive layers 3 on the vertical sidewalls of the device isolation films 7, on the dotted line in FIG. 6, can be avoided. Thus, the occurrence of short circuit failures ascribable to the residual film of the first conductive layers 3 may be reduced.

It should be noted that the relationship in Eq. (7) is implemented by controlling the etching amount for the silicon oxide film, which becomes the device isolation films 7 in the third embodiment, however, it is not limited to the structure and method described above, and other structures and methods are also possible.

Fourth Embodiment

Figure 14:
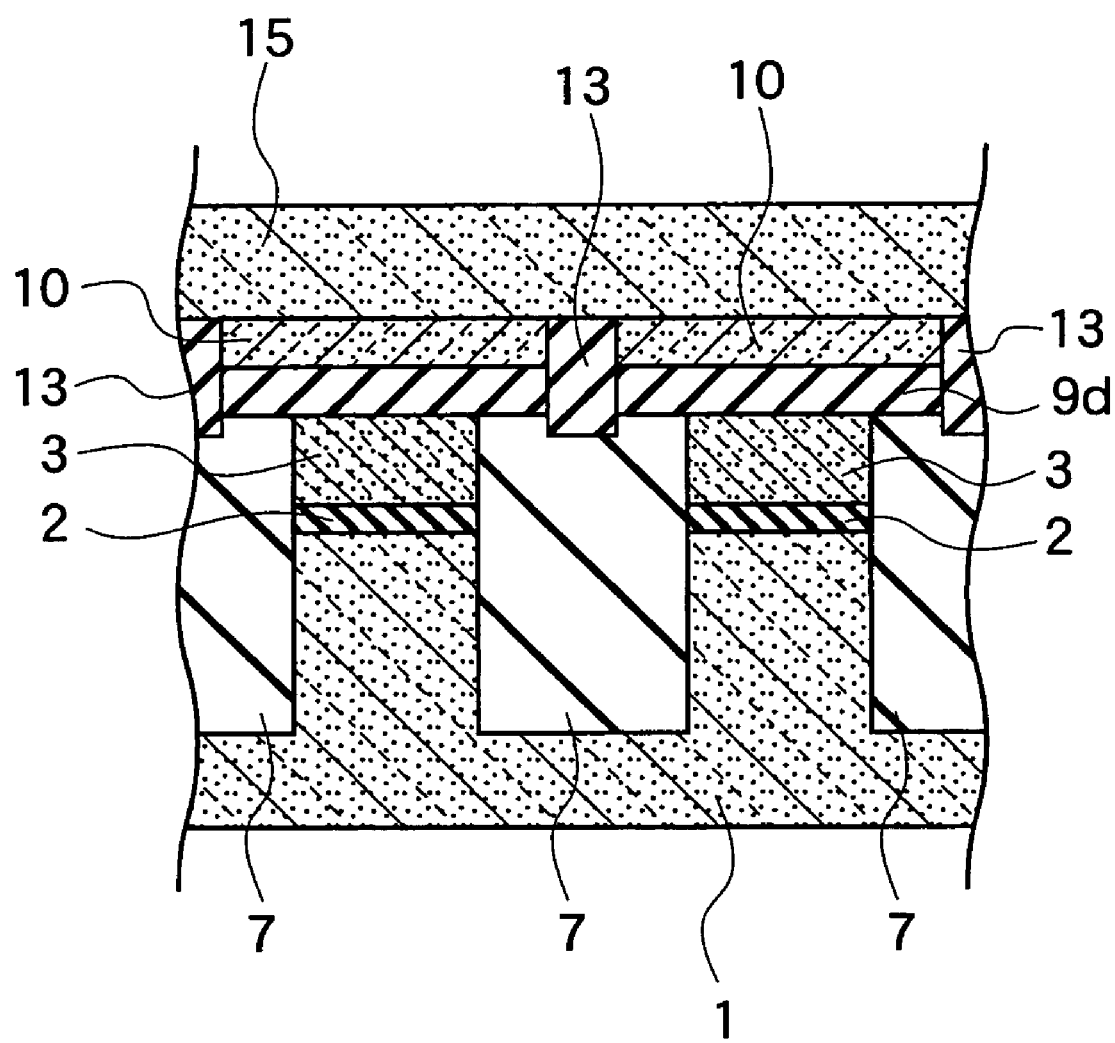
FIG. 14 is a schematic cross sectional view cut along the word line direction showing part of a memory cell matrix of a semiconductor memory according to a fourth embodiment of the present invention.

FIG. 14 is a cross sectional view cut along the length of the word lines WL1, WL2, . . . , WL32 as shown in FIG. 4B. A memory cell transistor of a semiconductor memory according to a fourth embodiment of the present invention, as shown in FIG. 14, includes: plurality of device isolation films 7, which run vertically parallel to each other between a plurality of memory cell columns; the first conductive layers 3, which are isolated from each other by the device isolation films 7 and implement parts of the memory cell transistors belonging to the respective memory cell columns; inter-electrode dielectrics 9d, which are made from an insulating film with a higher relative dielectric constant $\in_r$ than the device isolation films 7, and extend across from the top surface of the first conductive layers 3 to a part of the top surface of the device isolation films 7, and are separated at constant intervals over each device isolation film 7 along the row-direction; second conductive layers 10, which are arranged on the inter-electrode dielectric 9d, respectively, and are separated at constant intervals over each device isolation film 7 along the row-direction; upper isolation plugs 13 made of insulating films having a lower relative dielectric constant $\in_r$ than the inter-electrode dielectric 9d and are inserted into the grooves, disposed at separating areas for separating the split inter-electrode dielectrics 9d at constant intervals; and a third conductive layer 15, which is arranged on the second conductive layers 10, and connect the second conductive layers 10 of adjacent memory cell columns to each other. Although the illustration of the plan view is omitted, each of the first conductive layers 3 is cut into a topology of a rectangular parallelepiped, and isolated rectangular parallelepipeds are arranged along the column and row-directions.

In other words, the inter-electrode dielectrics 9d, which are between adjacent cells partitioned by the device isolation films 7, are separated on the device isolation films 7, and the upper isolation plugs 13, which have a lower relative dielectric constant $\in_r$ than the inter-electrode dielectrics 9d, are filled in the separating grooves. Thus, it is a structure that allows sufficient insulation to be ensured between the first conductive layers 3 and the second conductive layers 10 while reducing the stray capacitance between the first conductive layers 3 of adjacent cells via the split inter-electrode dielectrics 9d. It should be noted that short circuit failures between the first conductive layers 3 and the second conductive layers 10 are not a problem with the structure according to the fourth embodiment.

The technical advantage of the structure of the memory cell transistor of the semiconductor memory according to the fourth embodiment is preferably achieved under a condition in which the capacitance ratio C2/C1 is greater than 1, where the capacitance ratio C2/C1 is defined by Eq. (4). In the case where the capacitance ratio C2/C1 is 1.5, the structure according to the fourth embodiment allows a reduction in the electrical interference effect by approximately twenty percent. Otherwise, it is effectively the same as the first through to third embodiments, and thus duplicate descriptions are omitted.

A fabrication method of the semiconductor memory according to the fourth embodiment of the present invention is described with reference to FIG. 15A to FIG. 15E. It should be noted that the fabrication method of the semiconductor memory given below is merely an example, and other various fabrication methods including modifications on this fabrication method may naturally be implemented.

Figure 15A:
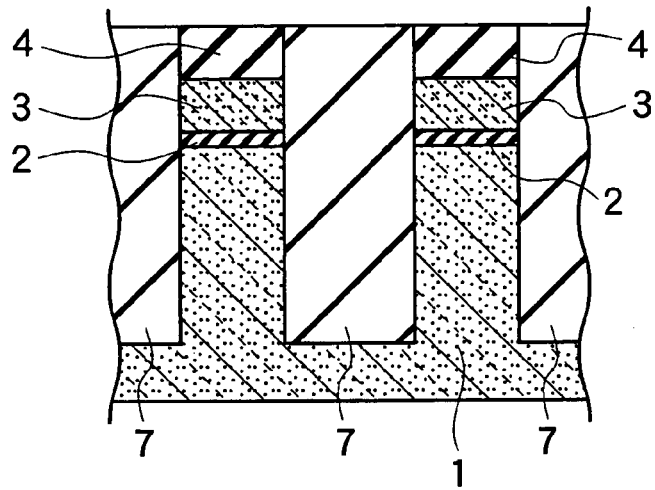
FIG. 15A is a process flow cross section showing part of the memory cell matrix cut along the row-direction shown in FIGS. 4A and 4B, explaining the manufacturing method of the semiconductor memory according to the fourth embodiment.
Figure 15B:
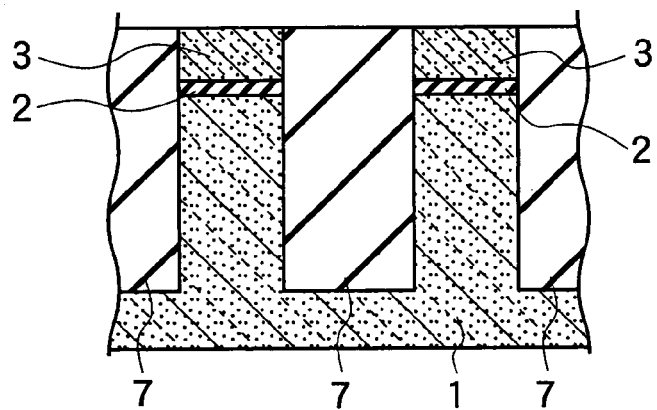
FIG. 15B is a subsequent process flow cross section showing part of the memory cell matrix of the semiconductor memory according to the fourth embodiment cut along the row-direction after the process stage shown in FIG. 15A.
Figure 15C:
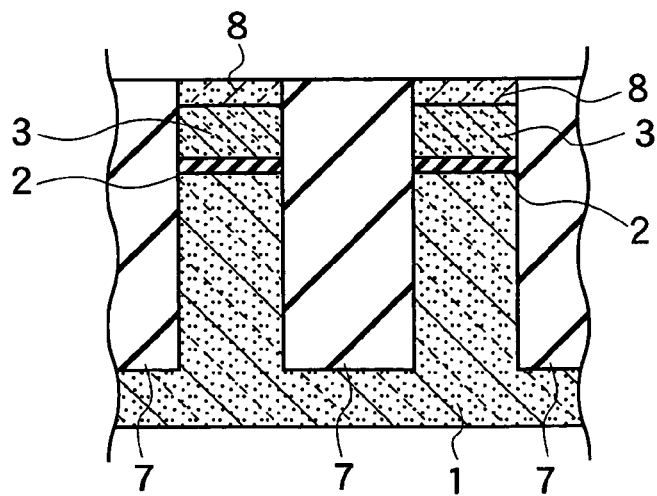
FIG. 15C is a subsequent process flow cross section showing part of the memory cell matrix of the semiconductor memory according to the fourth embodiment cut along the row-direction after the process stage shown in FIG. 15B.

(a) To begin with, the structural cross-section in FIG. 15A is obtained by a method (see FIG. 5A and FIG. 5B) similar to the fabrication method of the semiconductor memory according to the first embodiment. The structural cross section in FIG. 15B is then obtained by selectively etching the silicon nitride films 4 and the silicon oxide film 5 through wet etching at an etching speed that is almost equal to the silicon oxide film 5 and the silicon nitride films 4. It should be noted that as another means for obtaining the structural cross section in FIG. 15B, once the structural cross section in FIG. 15A is obtained, the structural cross section in FIG. 15B can be obtained through dry etching such as RIE with approximately the same etching rate for the silicon nitride films 4 and the silicon oxide film 5. Furthermore, as another means for obtaining an equivalent structure to the structural cross section in FIG. 15B, once the structural cross section in FIG. 15A is obtained, the structural cross section in FIG. 15C can be obtained by selectively removing the silicon nitride films 4 through wet etching, so subsequently, conductive layers 8 with a thickness of approximately 10 to 200 nm is deposited by CVD, and the surface is plagiarized, using the device isolation films 7, which are made of a silicon oxide film or the like, as stoppers.

(b) Next, the inter-electrode dielectric 9d with a higher relative dielectric constant $\in_r$ than the silicon oxide film is formed with an equivalent thickness of approximately 1 to 30 nm in terms of the silicon oxide film thickness. A single-layered high dielectric constant film is exemplified here as the inter-electrode dielectric 9d; however, a multi-layered structure made of combinations of two or more layers of a silicon oxide film, a silicon nitride film, or another high dielectric constant film such as those described within the first embodiment may also be implemented.

(c) Subsequently, the second conductive layer 10 is blanket deposited with a thickness of approximately 10 to 200 nm by CVD. Furthermore, a silicon nitride film 11 is blanket deposited with a thickness of approximately 50 to 200 nm on the second conductive layer 10 by CVD. Moreover, photoresist films 12 are coated on this silicon nitride film 11, and as shown in FIG. 15D, are exposed and developed through photolithography.

Figure 15D:
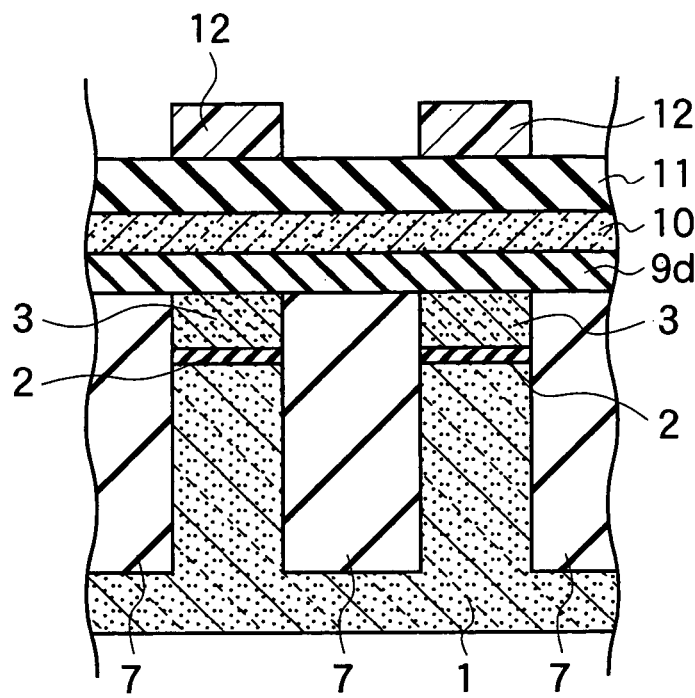
FIG. 15D is a subsequent process flow cross section showing part of the memory cell matrix of the semiconductor memory according to the fourth embodiment cut along the row-direction after the process stage shown in FIG. 15C.

(d) The silicon nitride film 11 is then etched such that the edges become regular mesa tapers using the photoresist films 12 shown in FIG. 15D as masks. When the photoresist films 12 are removed after the etching process is finished, a mask made from the silicon nitride film 11 including openings narrower than the interval between the photoresist films 12 as shown in FIG. 15D due to the tapered form is completed. Part of the second conductive layer 10 and the inter-electrode dielectric 9d are selectively etched through RIE using the silicon nitride film 11 with narrow openings as a mask, and if the silicon nitride film 11 is then selectively removed, trenches narrower than the resolution limit of the optical lithography, which is prescribed by Rayleigh's criteria, are formed through photolithography.

Figure 15E:
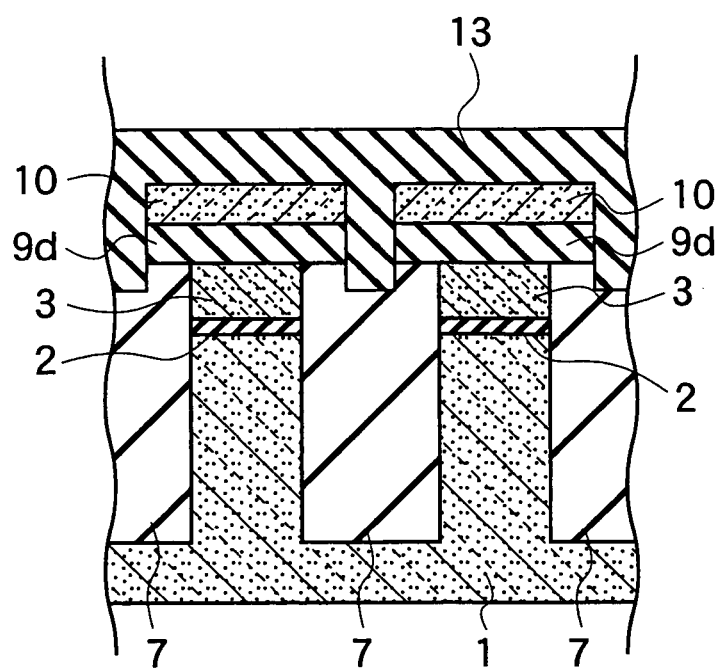
FIG. 15E is a subsequent process flow cross section showing part of the memory cell matrix of the semiconductor memory according to the fourth embodiment cut along the row-direction after the process stage shown in FIG. 15D.

(e) Next, an insulating film 13 for the upper isolation plug such as a silicon oxide film or the like is blanket deposited with a thickness of approximately 10 to 200 nm by CVD as shown in FIG. 15E. The insulating film 13 is then plagiarized through CMP using the second conductive layer as a stopper so as to embed the insulating film 13 in the groove between the split second conductive layers 10 and the groove between the split inter-electrode dielectrics 9*d*, so the upper isolation plug 13 is delineated. By further forming the third conductive layer 15, made of phosphorous (P) doped polysilicon, with a thickness of approximately 10 to 200 nm, by CVD, the structural cross section of the memory cell transistor of the semiconductor memory according to the fourth embodiment as shown in FIG. 14 is completed.

As such, with the fabrication method of the semiconductor memory according to the fourth embodiment of the present invention, a reduction in the coupling ratio (coupling capacitance) between the first conductive layers (floating gate electrodes) 4 and the second conductive layer (control gate electrode) 10 can be avoided, while a structure with a small bypassing edge-capacitance C2 via the split inter-electrode dielectrics 9*d* may be implemented, so therefore the fabrication yield is high.

(Other Embodiments)

Various modifications will become possible for those skilled in the art after receiving the teaching of the present disclosure without departing from the scope thereof.

For example, in the description of the already given first through to third embodiments, in the case where the protrusion corners of the device isolation films 7 are chamfered so as to make regular-mesa planes with the protrusions having a trapezoidal top cross-sectional topology, has been described. However, without the topology of the chamfered portions of the protrusions being limited hereto, the protrusion corners may be chamfered into a curve, for example. Alternatively, the chamfered portion may be implemented by a polyhedral side surface defined by a plurality of tapered surfaces intersecting each other, each of the tapered surfaces having different tapered angles.

Furthermore, in the above description of the fourth embodiment, the case where the horizontal level of the top surface of the device isolation films 7 and the horizontal level of the top surface of the first conductive layers (floating gate electrodes) 3 are equal, has been described; however, the position of the top surface of the device isolation films 7 may be higher or lower than the horizontal level of the top surface of the first conductive layers (floating gate electrodes) 3.

Thus, the present invention of course encompasses various embodiments and modifications and the like which are not detailed above. Therefore, the scope of the present invention will be defined in the following claims.

What is claimed is:

1. A semiconductor memory having a memory cell matrix including a plurality of memory cell transistors serially arranged along row- and column-directions, the memory cell matrix comprising:

a plurality of device isolation films having flat top surfaces, running along the column-direction, each of the device isolation films arranged alternately between the memory cell transistors aligned along the row-direction, a pair of edges of each of the top surfaces are respectively beveled obliquely so as to provide a pair of nonparallel slanting surfaces, establishing a regular-mesa shape of the device isolation films in a cross sectional view cut along the row-direction;

a plurality of first conductive layers arranged along the row and column-directions, a group of the first conductive layers arranged along the column-direction are assigned to a corresponding cell column, adjacent cell columns are isolated from each other by the device isolation film, top surfaces of the first conductive layers lie at a lower level than the top surfaces of the device isolation films;

an inter-electrode dielectric arranged both on the device isolation films and the first conductive layers so as to implement a level top on each of the device isolation films so that the inter-electrode dielectric can be shared by the memory cell transistors arranged along the row-direction belonging to different cell columns, relative dielectric constant of the inter-electrode dielectric is higher than relative dielectric constant of the device isolation films; and a second conductive layer running along the row-direction, arranged on the inter-electrode dielectric so that the second conductive layer can be shared by the memory cell transistors arranged along the row-direction belonging to different cell columns.

2. The semiconductor memory of claim 1, wherein top portion of each of the device isolation films has a trapezoidal cross-sectional topology, the pair of nonparallel slanting surfaces serves as legs of the trapezoidal cross-sectional topology, and the flat top surface serves as an upper base of the trapezoidal cross-sectional topology, in the cross sectional view cut along the row-direction.

3. The semiconductor memory of claim 2, wherein the slanting surfaces of the trapezoidal cross-sectional topology decline so as to intersect the top surface of the first conductive layer.

4. The semiconductor memory of claim 2, wherein the slanting surfaces of the trapezoidal cross-sectional topology decline so as to intersect the top surface of the first conductive layer at an angle greater than 90°, implementing the regular-mesa shape such that the width of the device isolation film gradually decreases towards the top surface.

5. The semiconductor memory of claim 2, wherein a tangential plane of the slanting surface of the trapezoidal cross-sectional topology intersects with a side surface of the first conductive layer.

6. The semiconductor memory of claim 2, wherein a thickness of the inter-electrode dielectric multiplied by relative dielectric constant of the inter-electrode dielectric is larger than a width of the first conductive layers measured along the row-direction multiplied by relative dielectric constant of the device isolation films.

7. The semiconductor memory of claim 1, wherein the inter-electrode dielectric is a single layer film selected from the group consisting of a silicon nitride film, an aluminum oxide film, a hafnium oxide film and a zirconium oxide film or a composite film including at least one of the single layer film.

8. A semiconductor memory having a memory cell matrix including a plurality of memory cell transistors serially arranged along row- and column-directions, the memory cell matrix comprising:

a plurality of device isolation films running along the column-direction, each of the device isolation films arranged alternately between the memory cell transistors aligned along the row-direction;

a plurality of first conductive layers arranged along the row- and column-directions, a group of the first conductive layers arranged along the column-direction are assigned to a corresponding cell column, adjacent cell columns are isolated from each other by the device isolation film, top surfaces of the first conductive layers lie at a lower level than top surfaces of the device isolation films;

an inter-electrode dielectric arranged both on the device isolation films and the first conductive layers so that the inter-electrode dielectric can be shared by the memory cell transistors arranged along the row-direction belonging to different cell columns, relative dielectric constant of the inter-electrode dielectric is higher than relative dielectric constant of the device isolation films; and a second conductive layer running along the row-direction, arranged on the inter-electrode dielectric so that the second conductive layer can be shared by the memory cell transistors arranged along the row-direction belonging to different cell columns, wherein upper corners of the device isolation films are respectively chamfered in a cross sectional view cut along the row-direction, wherein top portion of each of the device isolation films has a trapezoidal cross-sectional topology in the cross sectional view cut along the row-direction, a thickness of the inter-electrode dielectric at a slanting surface of the trapezoidal cross-sectional topology is thinner than a thickness of the inter-electrode dielectric on the first conductive layers.

9. A semiconductor memory having a memory cell matrix including a plurality of memory cell transistors serially arranged along row- and column-directions, the memory cell matrix comprising:

a plurality of device isolation films having flat top surfaces, running along the column-direction, each of the device isolation films arranged alternately between the memory cell transistors aligned along the row-direction;

a plurality of first conductive layers arranged along the row and column-directions, a group of the first conductive layers arranged along the column-direction are assigned to a corresponding cell column, adjacent cell columns are isolated from each other by the device isolation film, top surfaces of the first conductive layers lie at a lower level than top surfaces of the device isolation films;

an inter-electrode dielectric arranged both on the device isolation films and the first conductive layers so as to implement a level top on each of the device isolation films so that the inter-electrode dielectric can be shared by the memory cell transistors arranged along the row-direction belonging to different cell columns, relative dielectric constant of the inter-electrode dielectric is higher than relative dielectric constant of the device isolation films; and a second conductive layer running along the row-direction, arranged on the inter-electrode dielectric so that the second conductive layer can be shared by the memory cell transistors arranged along the row-direction belonging to different cell columns, the second conductive layer having downwardly protruding portions, each of the protruding portions having a flat bottom surface facing to corresponding top surface of the first conductive layers and a pair of nonparallel slanting surfaces so as to establish a reverse-mesa shape of the protruding portions, wherein a width of the bottom surface of the downwardly protruding portions measured along the row-direction is larger than a value obtained by subtracting a thickness of the inter-electrode dielectric multiplied by two from a width of the top surface of the first conductive layers measured along the row-direction.

10. The semiconductor memory of claim 9, wherein the width of the bottom surface of the downwardly protruding portions measured along the row-direction is larger than the width of the top surface of the first conductive layers measured along the row-direction.

11. A semiconductor memory having a memory cell matrix including a plurality of memory cell transistors serially arranged along row- and column-directions, the memory cell matrix comprising:

a plurality of device isolation films running along the column-direction, each of the device isolation films arranged alternately between the memory cell transistors aligned along the row-direction;

a plurality of first conductive layers arranged along the row- and column-directions, a group of the first conductive layers arranged along the column-direction are assigned to a corresponding cell column, adjacent cell columns are isolated from each other by the device isolation film, top surfaces of the first conductive layers lie at a lower level than top surfaces of the device isolation films;

an inter-electrode dielectric arranged both on the device isolation films and the first conductive layers so that the inter-electrode dielectric can be shared by the memory cell transistors arranged along the row-direction belonging to different cell columns, relative dielectric constant of the inter-electrode dielectric is higher than relative dielectric constant of the device isolation films; and a second conductive layer running along the row-direction, arranged on the inter-electrode dielectric so that the second conductive layer can be shared by the memory cell transistors arranged along the row-direction belonging to different cell columns, the second conductive layer having downwardly protruding portions, each having bottom surface facing to corresponding top surface of the first conductive layers, wherein a width of the bottom surface of the downwardly protruding portions measured along the row-direction is larger than a value obtained by subtracting a thickness of the inter-electrode dielectric multiplied by two from a width of the top surface of the first conductive layers measured along the row-direction, a thickness of the inter-electrode dielectric multiplied by relative dielectric constant of the inter-electrode dielectric is larger than a width of the first conductive layers measured along the row-direction multiplied by relative dielectric constant of the device isolation films.

12. A semiconductor memory having a memory cell matrix including a plurality of memory cell transistors serially arranged along row- and column-directions, the memory cell matrix comprising:

a plurality of device isolation films running along the column-direction, each of the device isolation films arranged alternately between the memory cell transistors aligned along the row-direction;

a plurality of first conductive layers arranged along the row and column-directions, a group of the first conductive layers arranged along the column-direction are assigned to a corresponding cell column, adjacent cell columns are isolated from each other by the device isolation film, top surfaces of the first conductive layers lie at a lower level than top surfaces of the device isolation films;

a plurality of inter-electrode dielectrics aligned along the row-direction on the first conductive layers, each of the inter-electrode dielectrics are separated by a groove arranged on a corresponding device isolation film, relative dielectric constant of the inter-electrode dielectrics is higher than relative dielectric constant of the device isolation films;

a plurality of second conductive layers aligned along the row-direction on the inter-electrode dielectric, each of the second conductive layers are separated by the groove arranged on the corresponding device isolation film;

a plurality of upper isolation plugs embedded respectively in the grooves; arranged on a corresponding device isolation film; relative dielectric constant of the upper isolation plugs is lower than relative dielectric constant of the inter-electrode dielectric; and a third conductive layer running along the row-direction, arranged on the second conductive layers so that the third conductive layer can be connected to the second conductive layers of the memory cell transistors belonging to different cell columns.

13. The semiconductor memory of claim 12, wherein a thickness of the inter-electrode dielectric multiplied by relative dielectric constant of the inter-electrode dielectric is larger than a width of the first conductive layers measured along the row-direction multiplied by relative dielectric constant of the device isolation films.

14. The semiconductor memory of claim 12, wherein each of the inter-electrode dielectrics is a single layer film selected from the group consisting of a silicon nitride film, an aluminum oxide film, a hafnium oxide film and a zirconium oxide film or a composite film including at least one of the single layer film.

* * * * *